US007242021B2

(12) United States Patent
Yamazaki et al.

(10) Patent No.: US 7,242,021 B2
(45) Date of Patent: Jul. 10, 2007

(54) SEMICONDUCTOR DEVICE AND DISPLAY ELEMENT USING SEMICONDUCTOR DEVICE

(75) Inventors: Shunpei Yamazaki, Tokyo (JP);
Satoshi Murakami, Tochigi (JP);
Shigeharu Monoe, Kanagawa (JP)

(73) Assignee: Semiconductor Energy Laboratory Co., Ltd., Kanagawa-ken (JP)

( * ) Notice: Subject to any disclaimer, the term of this patent is extended or adjusted under 35 U.S.C. 154(b) by 0 days.

(21) Appl. No.: 10/419,764

(22) Filed: Apr. 22, 2003

(65) Prior Publication Data

US 2003/0197178 A1 Oct. 23, 2003

(30) Foreign Application Priority Data

Apr. 23, 2002 (JP) ............................. 2002-121369
Apr. 26, 2002 (JP) ............................. 2002-127235

(51) Int. Cl.
*G02F 1/136* (2006.01)
*H01L 31/036* (2006.01)
(52) U.S. Cl. ..................... 257/59; 257/72; 257/306; 257/350; 349/43; 349/41
(58) Field of Classification Search .............. 257/347, 257/620, 636, 59, 60, 66, 310, 326, 350, 257/72, 89, 90, 73, 351; 349/143; 438/782, 438/624, 169, 156, 151; 369/43, 44, 45
See application file for complete search history.

(56) References Cited

U.S. PATENT DOCUMENTS 5,313,076 A 5/1994 Yamazaki et al.

(Continued)

FOREIGN PATENT DOCUMENTS

EP 1 128 430 A2 8/2001

(Continued)

OTHER PUBLICATIONS

U.S. Appl. No. 10/400,427; filed Mar. 28, 2003; Shunpei Yamazaki et al.; "Semiconductor Display Device".

(Continued)

*Primary Examiner*—Evan Pert
*Assistant Examiner*—Fazli Erdem
(74) *Attorney, Agent, or Firm*—Nixon Peabody LLP; Jeffrey L. Costellia

(57) ABSTRACT

The present invention achieves the enhancement of stability of operational performance of a display device and the enlargement of margin of design in circuit designing. In a semiconductor device including a semiconductor, a gate insulation film which is brought into contact with the semiconductor, a gate electrode which faces an active layer by way of the gate insulation film, a first inorganic insulation film which is formed above the active layer, an SOG film which is formed on the first inorganic insulation film, and a second inorganic insulation film which is formed on the SOG film, and wiring which is formed on the second inorganic insulation film, an inner wall surface of a first opening portion formed in the SOG film is covered with the second inorganic insulation film and, at the same time, a second opening portion which is formed in a laminated body including the gate insulation film, the first inorganic insulation film and the second inorganic insulation film is provided to the inside of the first opening portion, and the semiconductor and the wiring are connected to each other through the first opening portion and the second opening portion.

21 Claims, 17 Drawing Sheets

U.S. PATENT DOCUMENTS

| | | | |
|---|---|---|---|
| 5,459,596 A | 10/1995 | Ueda et al. | |
| 5,583,369 A | 12/1996 | Yamazaki et al. | |
| 5,585,949 A | 12/1996 | Yamazaki et al. | |
| 5,696,386 A | 12/1997 | Yamazaki | |
| 5,706,064 A | 1/1998 | Fukunaga et al. | |
| 5,733,797 A * | 3/1998 | Yamaha | 438/624 |
| 5,781,254 A | 7/1998 | Kim et al. | |
| 5,818,550 A | 10/1998 | Kadota et al. | |
| 5,946,561 A | 8/1999 | Yamazaki et al. | |
| 5,956,105 A | 9/1999 | Yamazaki et al. | |
| 5,982,460 A | 11/1999 | Zhang et al. | |
| 5,990,542 A | 11/1999 | Yamazaki | |
| 6,037,712 A | 3/2000 | Codama et al. | |
| 6,057,904 A * | 5/2000 | Kim et al. | 349/143 |
| 6,069,443 A | 5/2000 | Jones et al. | |
| 6,115,090 A | 9/2000 | Yamazaki | |
| 6,136,624 A | 10/2000 | Kemmochi et al. | |
| 6,150,692 A | 11/2000 | Iwanaga et al. | |
| 6,215,154 B1 * | 4/2001 | Ishida et al. | 257/347 |
| 6,236,106 B1 * | 5/2001 | Sato | 257/638 |
| 6,252,297 B1 | 6/2001 | Kemmochi et al. | |
| 6,271,066 B1 | 8/2001 | Yamazaki et al. | |
| 6,271,543 B1 | 8/2001 | Ohtani et al. | |
| 6,274,516 B1 * | 8/2001 | Kamei et al. | 438/782 |
| 6,294,799 B1 | 9/2001 | Yamazaki et al. | |
| 6,306,694 B1 | 10/2001 | Yamazaki et al. | |
| 6,346,718 B1 | 2/2002 | Yamanaka et al. | |
| 6,372,558 B1 | 4/2002 | Yamanaka et al. | |
| 6,429,053 B1 | 8/2002 | Yamazaki et al. | |
| 6,492,659 B1 | 12/2002 | Yamazaki et al. | |
| 6,515,300 B2 | 2/2003 | den Boer et al. | |
| 6,521,913 B1 * | 2/2003 | Murade | 257/59 |
| 6,538,301 B1 * | 3/2003 | Yamada et al. | 257/620 |
| 6,562,672 B2 | 5/2003 | Yamazaki et al. | |
| 6,593,990 B1 | 7/2003 | Yamazaki | |
| 6,599,818 B2 | 7/2003 | Dairiki | |
| 6,605,826 B2 | 8/2003 | Yamazaki et al. | |
| 6,608,353 B2 | 8/2003 | Miyazaki et al. | |
| 6,614,076 B2 | 9/2003 | Kawasaki et al. | |
| 6,657,230 B1 | 12/2003 | Murade | |
| 6,664,145 B1 | 12/2003 | Yamazaki et al. | |
| 6,664,732 B2 | 12/2003 | Yamazaki et al. | |
| 6,689,492 B1 | 2/2004 | Yamazaki et al. | |
| 6,768,259 B2 | 7/2004 | Hirano | |
| 6,774,578 B2 | 8/2004 | Tanada | |
| 6,777,710 B1 | 8/2004 | Koyama | |
| 6,778,232 B2 | 8/2004 | Nakata et al. | |
| 6,791,129 B2 | 9/2004 | Inukai | |
| 6,791,521 B2 | 9/2004 | Isami et al. | |
| 6,822,629 B2 | 11/2004 | Yamazaki et al. | |
| 6,828,950 B2 | 12/2004 | Koyama | |
| 6,911,688 B2 * | 6/2005 | Yamazaki et al. | 257/296 |
| 7,038,239 B2 | 5/2006 | Murakami et al. | |
| 2001/0005606 A1 | 6/2001 | Tanaka et al. | |
| 2001/0009283 A1 | 7/2001 | Arao et al. | |
| 2001/0030322 A1 | 10/2001 | Yamazaki et al. | |
| 2001/0036462 A1 | 11/2001 | Fong et al. | |
| 2001/0051416 A1 | 12/2001 | Yamazaki et al. | |
| 2001/0053559 A1 | 12/2001 | Nagano et al. | |
| 2001/0055841 A1 | 12/2001 | Yamazaki et al. | |
| 2002/0036462 A1 | 3/2002 | Hirano | |
| 2002/0145116 A1 | 10/2002 | Choo et al. | |
| 2002/0155706 A1 | 10/2002 | Mitsuki et al. | |
| 2003/0057419 A1 | 3/2003 | Murakami et al. | |
| 2003/0090447 A1 | 5/2003 | Kimura | |
| 2003/0129790 A1 | 7/2003 | Yamazaki et al. | |
| 2003/0189207 A1 * | 10/2003 | Murakami et al. | 257/59 |
| 2003/0189210 A1 * | 10/2003 | Yamazaki et al. | 257/72 |
| 2003/0193054 A1 | 10/2003 | Hayakawa et al. | |
| 2003/0197178 A1 | 10/2003 | Yamazaki et al. | |
| 2003/0206332 A1 | 11/2003 | Yamazaki et al. | |
| 2003/0210358 A1 | 11/2003 | Zhang et al. | |
| 2003/0230764 A1 | 12/2003 | Yamazaki et al. | |
| 2004/0072380 A1 | 4/2004 | Yamazaki et al. | |
| 2004/0075094 A1 * | 4/2004 | Yamazaki et al. | 257/72 |
| 2004/0080263 A1 | 4/2004 | Yamazaki et al. | |

FOREIGN PATENT DOCUMENTS

| | | |
|---|---|---|
| JP | 1-156725 | 6/1989 |
| JP | 02-039541 | 2/1990 |
| JP | 2-234134 | 9/1990 |
| JP | 07-273191 | 10/1995 |
| JP | 08-203876 | 8/1996 |
| JP | 10-39334 | 2/1998 |
| JP | 10-056182 | 2/1998 |
| JP | 10-068972 | 3/1998 |
| JP | 10-307305 | 11/1998 |
| JP | 2001-189462 | 7/2001 |
| JP | 2001-313397 | 11/2001 |
| JP | 2001-356711 | 12/2001 |
| JP | 2003-017273 | 1/2003 |

OTHER PUBLICATIONS

U.S. Appl. No. 10/412,687; filed Apr. 14, 2003; Shunpei Yamazaki et al.; "Semiconductor Display Device and Manufacturing Method Thereof".

U.S. Appl. No. 10/407,184; filed Apr. 7, 2003; Satoshi Murakami et al.; "Semiconductor Element and Display Device Using the Same".

U.S. Appl. No. 10/412,234; filed Apr. 14, 2003; Masahiko Hayakawa et al.; "Display Device and Method of Fabricating the Same".

* cited by examiner

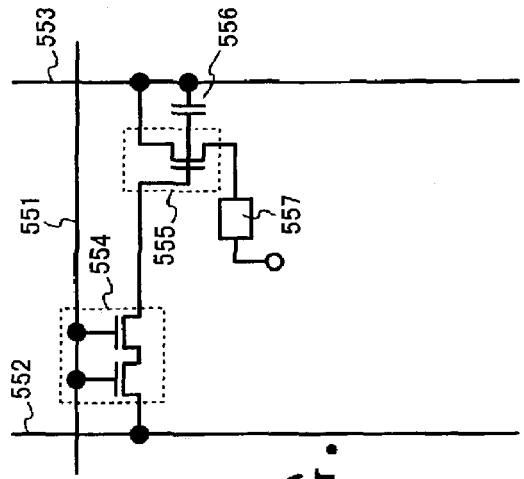
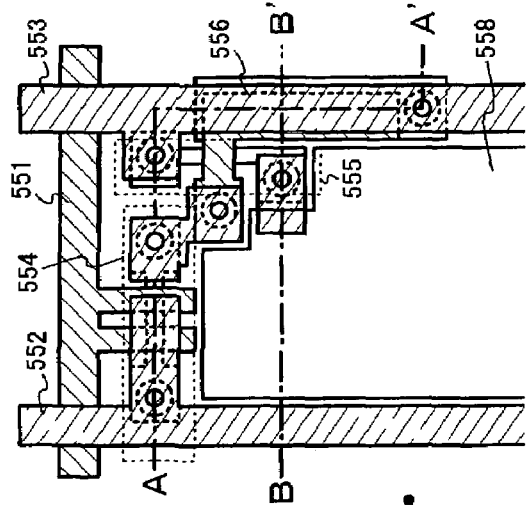
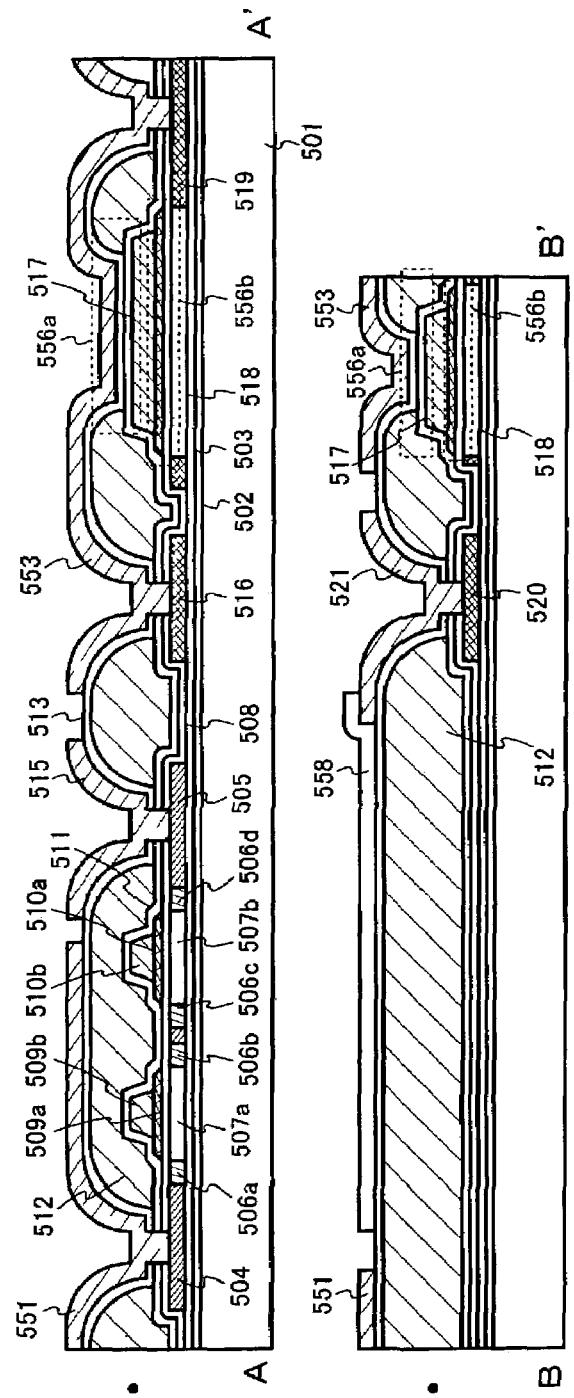
FIG. 5A
FIG. 5B
FIG. 5C
FIG. 5D

Characteristics of MOS-CV
( Si\SiO$_2$\RF-SP SiN\Li-dip\Al )

Characteristics of MOS-CV
(Si wafer\CVD SiN(100nm)\Al-Li)

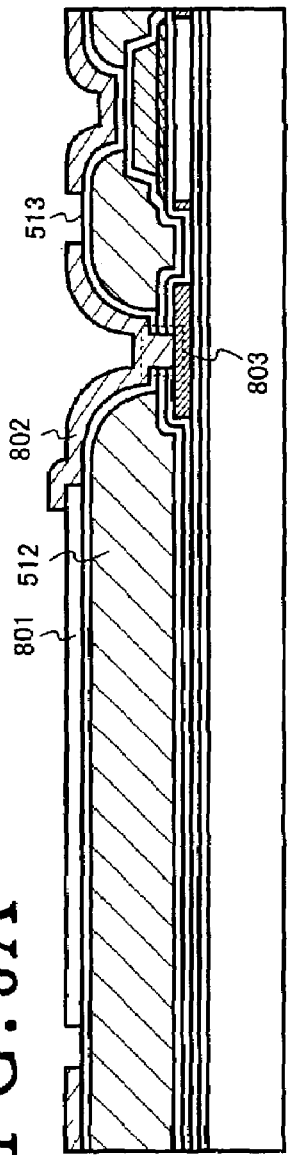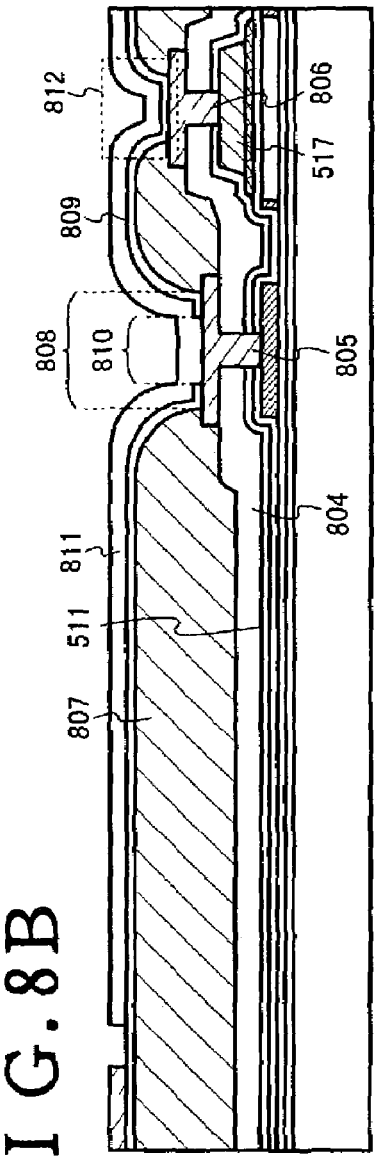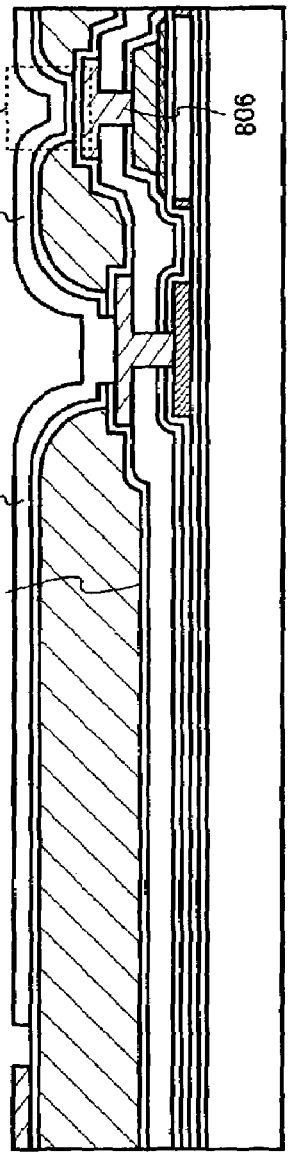

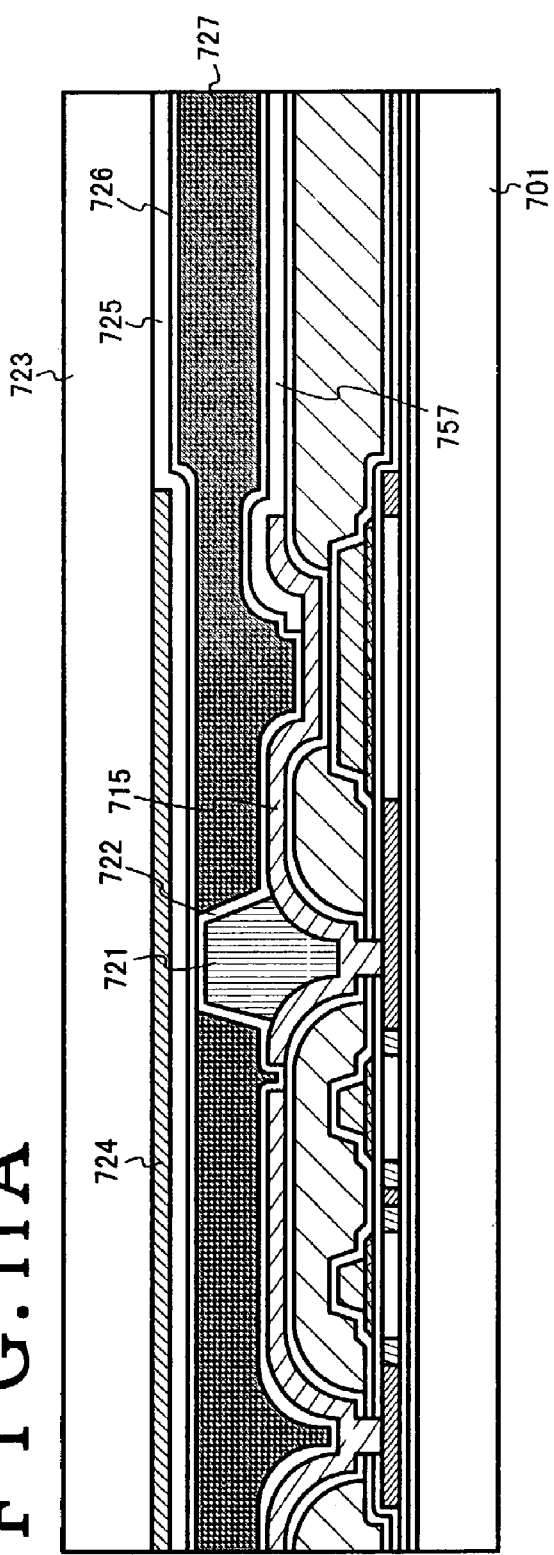
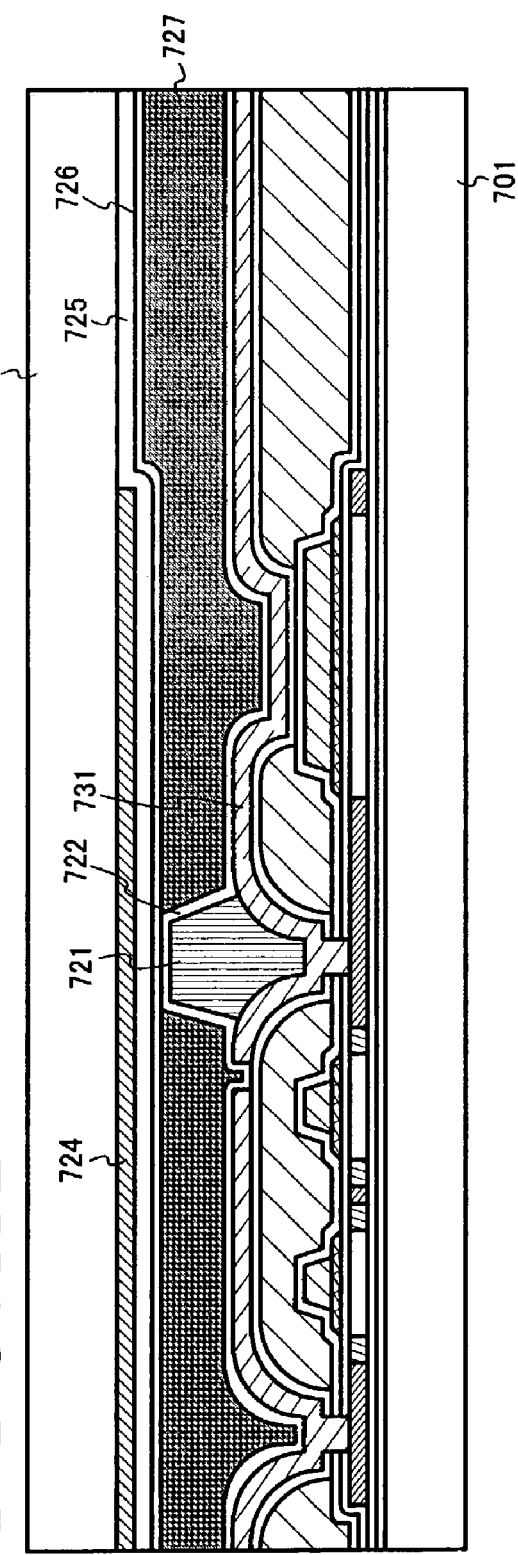
FIG.11A
FIG.11B

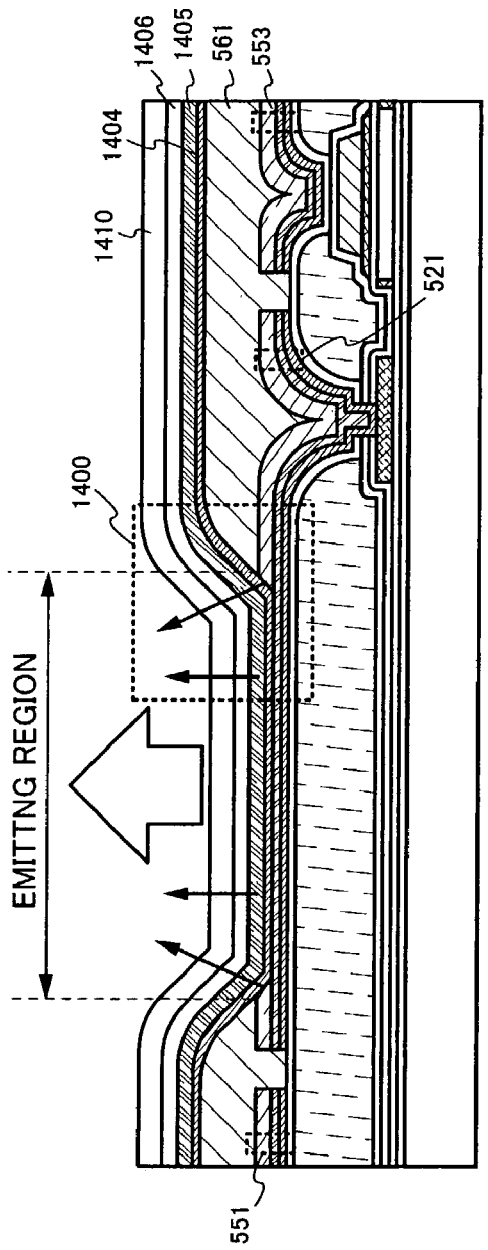
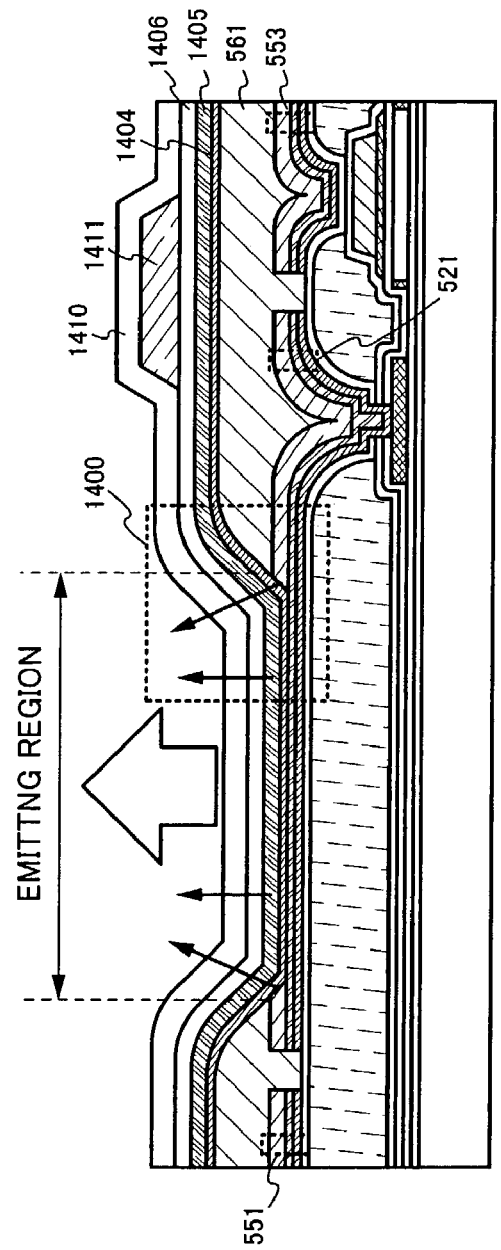
FIG.14A
FIG.14B

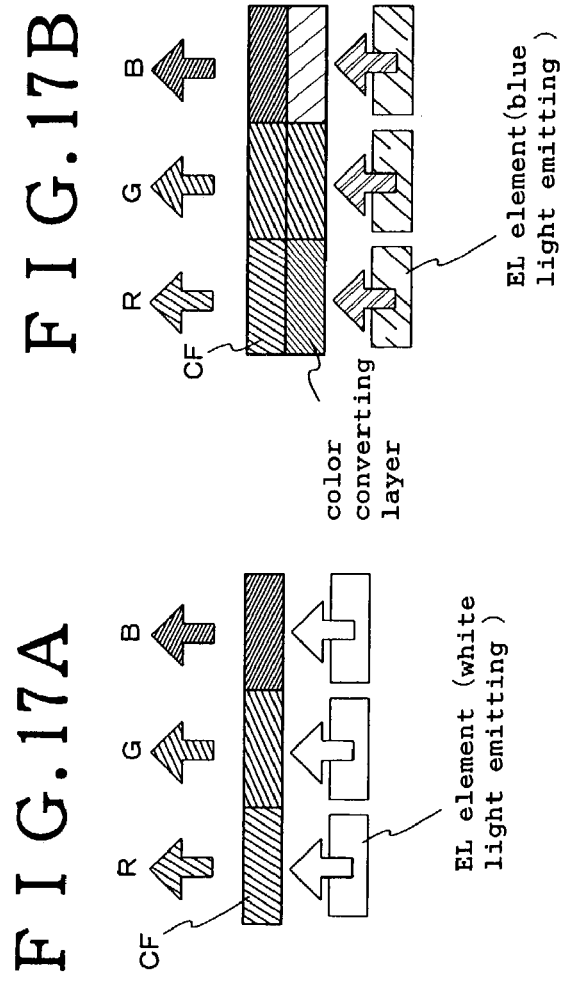

SEMICONDUCTOR DEVICE AND DISPLAY ELEMENT USING SEMICONDUCTOR DEVICE

BACKGROUND OF THE INVENTION

1. Field of the Invention

The present invention relates to a semiconductor device (typically transistor) and a manufacturing method thereof, and more particularly the present invention belongs to a technical field of a display device using thin film transistors as devices. That is, the present invention belongs to a technical field relating to a display device represented by a liquid crystal display device or an electroluminescence display device or the like, a technical field relating to a sensor represented by a CMOS sensor or the like, or a technical field relating to all semiconductor devices mounting other semiconductor integrated circuits.

2. Description of the Related Art

Recently, the development of a liquid crystal display device and an electroluminescence display device which integrates thin film transistors (TFTs) on a glass substrate has been in progress. Either one of these display devices constitutes one of the semiconductor devices which are characterized in that the thin film transistors are built in the glass substrate using a thin film forming technique, and liquid crystal elements or electroluminescence (hereinafter simply abbreviated as EL) elements are formed on various circuits which are constituted of thin film transistors thus functioning as a display device.

A circuit constituted of the thin film transistors has some surface irregularities and hence, in forming the liquid crystal elements or the EL elements on the circuit, an inorganic insulation film(inorganic insulating film), an organic insulation film or the like which is formed by a spin coating method is used as a leveling film. The inorganic insulation film formed by the spin coating method is also referred to as an SOG (Spin-On-Glass) film. Each pixel formed on a display part of the display device includes a pixel electrode therein, and the pixel electrode is connected to a thin film transistor through a contact hole formed in the above-mentioned leveling film.

However, it has been known that the SOG film has water permeability and water retentivity and hence, use of SOG film as an interlayer insulation film is limited. That is, although the SOG film may be used as a material which compensates for stepped portions in the technical field of LSI, there is no possibility that the SOG film is used as the interlayer insulation film (interlayer insulating film). This is because that when the SOG film is used as the interlayer insulation film, the SOG film allows moisture or the like to pass therethrough so that there is a fear that the moisture or the like adversely affects electronic characteristics (particularly leaking current or the like) of a transistor formed below the SOG film.

Further, even with an interlayer insulation film having a laminar structure which sandwiches the SOG film between other insulation films formed by a plasma CVD (Chemical Vapor Deposition) method or the like, for example, the SOG film is exposed in a cross section of a contact hole (also referred to as "via") so that there arises a problem of a so-called poisoned via which forms a moisture supply source and erodes wiring or the like.

The present invention has been made in view of the above-mentioned problems and it is an object of the present invention to provide, in manufacturing a display device using an SOG film as an insulation film for leveling surface irregularities attributed to semiconductor devices (typically thin film transistors), a technique which can solve problems on water permeability and water retentivity of the SOG film and can achieve the enhancement of stability of operational performance of the display device. Further it is also an object of the present invention to achieve the enhancement of image qualities of the display device in combination.

SUMMARY OF THE INVENTION

The present invention is characterized by achieving the above-mentioned objects by following means. That is, in a display device using an SOG film as an insulation film for leveling surface irregularities attributed to semiconductor-devices, particularly transistors (hereinafter, the insulation film being referred to as "leveling film"), an improvement is characterized in that the SOG film is formed as a leveling film on a first inorganic insulation film formed such that the first inorganic insulation film covers the semiconductor devices, first openings are formed in the leveling film and, thereafter, a second inorganic insulation film is formed such that the second insulation film covers the first openings, second openings are formed in the second inorganic insulation film newly using a photo resist or the like, and upper electrodes and lower electrodes which are present while sandwiching the leveling film therebetween are electrically connected to each other. Further, the present invention is also characterized by using a nitride insulation film as the first inorganic insulation film or the second inorganic insulation film.

Here, although the SOG film is classified into an organic-based SOG film and an inorganic-based SOG film, it is preferable to use the inorganic-system SOG film which exhibits a smaller degassing quantity in the present invention. As the inorganic-based SOG film, it is preferable to use an SiOx film, a PSG (phosphorus silicate glass) film, a BSG (boron silicate glass) film or a BPSG (boron phosphorus silicate glass) film which is formed by a spin coating method. Further, as a typical example of specific SOG films, OCD series which are products of Tokyo Ohka Kogyo Ltd are named. For example, an SOG film which has a dielectric constant in the range of 2.5 to 3.0 may be used. Also, an SOG film comprising the following structure may be used. It is needless to say that other known SOG films may be used.

[formula 1]

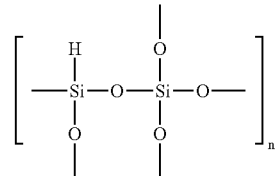

BRIEF DESCRIPTION OF THE DRAWINGS

FIGS. 5A–D are views showing the constitution of a pixel of a light emitting device.

FIGS. 8A–C are views showing the cross-sectional structure of the light emitting device.

FIG. 11A and FIG. 11B are views showing the cross-sectional structure of the liquid crystal display device.

FIG. 14A and FIG. 14B are views showing the cross-sectional structure of the light emitting device.

FIGS. 17A–C are views showing a light emitting method of the light emitting device.

DESCRIPTION OF THE PREFERRED EMBODIMENTS

Figure 1A:
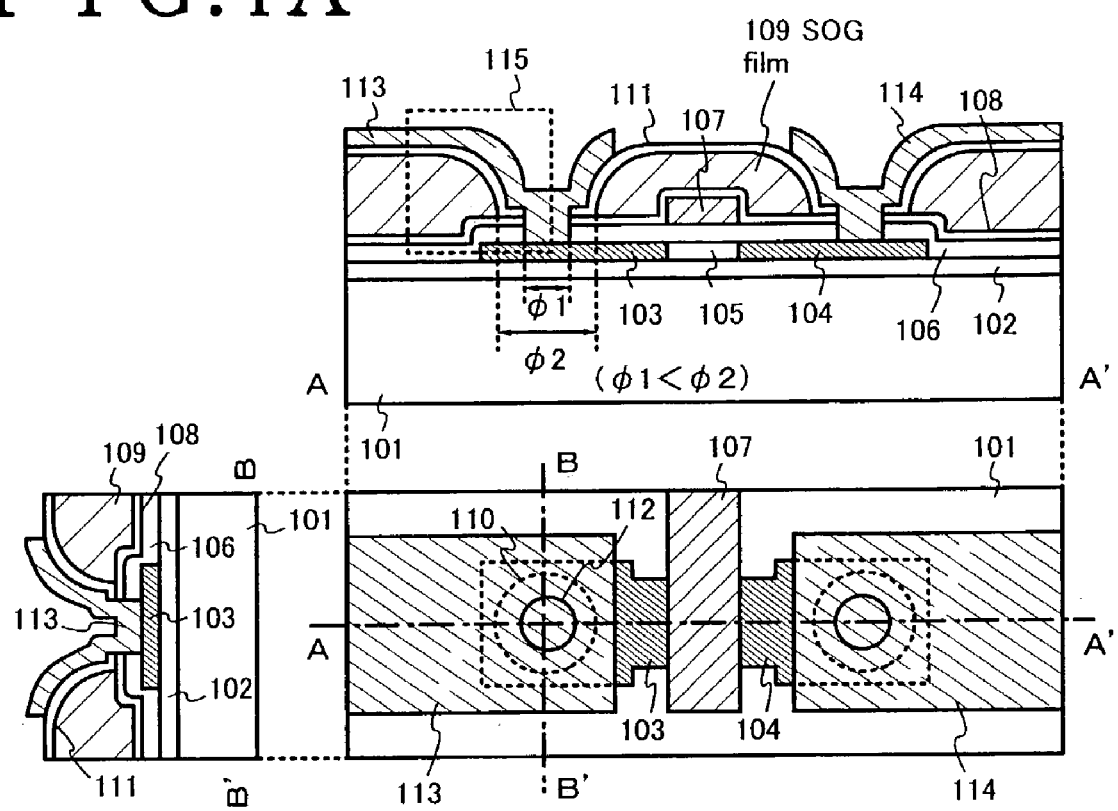
FIG. 1A and FIG. 1B are views showing the structure of a thin film transistor.
Figure 1B:
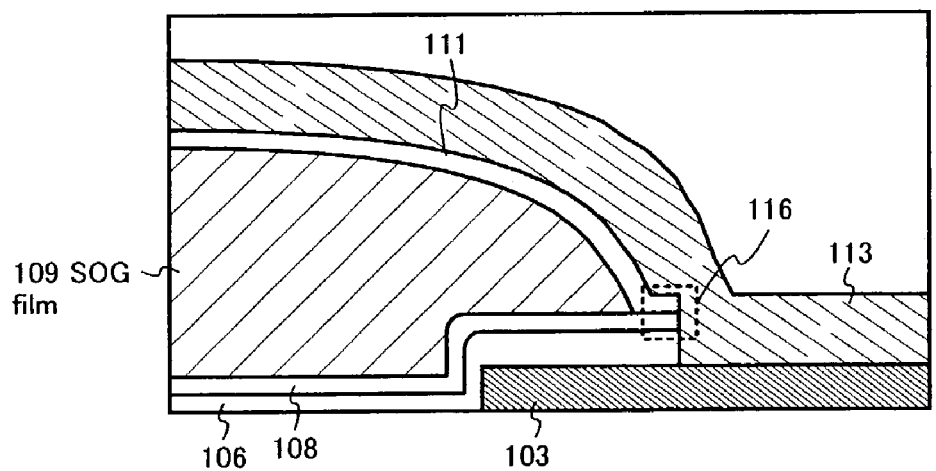

The present invention is explained in conjunction with FIGS. 1A–B. Here, an example which uses an SOG film, more specifically an SiOx film (typically silicon dioxide film) which is formed by a spin coating method is explained. In FIG. 1A, numeral 101 indicates a substrate, numeral 102 indicates a background film, numeral 103 indicates a source region, numeral 104 indicates a drain region, and numeral 105 indicates a channel forming region. These regions are constituted of semiconductor films formed on the background film 102. Further, numeral 106 indicates a gate insulation film (gate insulating film), numeral 107 indicates a gate electrode, numeral 108 indicates a first passivation film. The constitution described heretofore is the structure of a known thin film transistor and known various materials can be used as materials of respective portions.

Then, the thin film transistor of the present invention has the first feature thereof in a point that an SOG film is used as a leveling film 109 on the first passivation film 108 which is formed of an inorganic insulation film (a nitride insulation film being particularly preferable). It is preferable to select a film thickness of the leveling film 109 within a range of 1 to 4 μm (preferably 1.5 to 3 μm). The film thickness is freely set in view of the viscosity of a solution which constitutes a material for forming the SOG film, a rotational speed at the time of spin coating, or the like. Then, the second feature lies in a point that a first opening portion (expressed by diameter φ1) 110 is formed in the leveling film 109, while a second passivation film 111 which is formed of an inorganic insulation film (a nitride insulation film being particularly preferable) is formed such that the second passivation film 111 covers an upper surface of the leveling film 109 and an inner wall surface of the first opening portion 110.

Further, the third feature lies in a point that the second passivation film 111 includes a second opening portion (expressed by diameter φ2) 112 at a bottom surface of the first opening portion 110, and opening portions having a diameter equal to the diameter of the second opening portion 112 are also formed in the above-mentioned first passivation film 108 and the gate insulation film 106. That is, the present invention is characterized by the point that the second opening portion is formed in a laminated body including the gate insulation film 106, the first passivation film 108 and the second passivation film 111 in the inside of the first opening portion 110. Further, a source electrode 113 is connected to the source region 103 through the first opening portion 110 and the second opening portion 112 and, while the drain electrode 114 is connected to the drain region 104 in the same manner as the source electrode 113.

Here, as the first passivation film 108 and the second passivation film 111, a silicon nitride film, a silicon nitride oxide film, a silicon oxide nitride film, an aluminum nitride film, a nitride oxide aluminum film or an aluminum oxide nitride film can be used. Further, it is also possible to provide a laminated film which includes these films at least at a portion thereof. Further, it may be also possible to adopt a laminar structure which forms the first passivation film 108 on a silicon oxide film. Further, it is preferable that the diameter φ1 is 2–10 μm (more preferably 3–5 μm) and the diameter φ2 is 1–5 μm (more preferably 2–3 μm). However, since a design rule of the diameter of the opening portion is changed also depending on the accuracy of photolithography step, it is unnecessary to define numerical value ranges of these diameters. That is, it is sufficient that the relationship φ1<φ2 is satisfied anyway.

An enlarged view of a portion of the region 115 which is surrounded by a dotted line is shown in FIG. 1B. FIG. 1B shows portions of the first opening portion 110 and the second opening portion 112. Here, in FIG. 1B, at a portion indicated by numeral 116, the first passivation film 108 and the second passivation film 111 are closely adhered to each other thus forming a state in which the leveling film (SOG film) 109 is sealed. Here, a length of the adhered region, that is a length of a region where the first passivation film 108 and the second passivation film 111 are brought into contact with each other may preferably be 0.3–3 μm (more preferably 1–2 μm) in width. However, basically, it is sufficient that the radius of the first opening portion 110 is larger than the radius of the second opening portion 112 by 0.3–3 μm.

The SOG film used in the present invention is formed by a technique in which a thin film is formed by applying solution containing a thin film forming material using a spin coating method and, thereafter, the formed thin film is heated (also referred to as "baking processing") to evaporate a solvent thus crosslinking the thin film forming material (typically forming siloxane coupling). Accordingly, when the baking temperature is insufficient, organic materials remain in the film and this may become a cause of degassing which follows thereafter. Particularly, when the display device is constituted by forming thin film transistors on a glass substrate or further by forming thin film transistors on the plastic film, the baking temperature is determined based on the heat resistance of the glass substrate or the plastic film and hence, it is necessary to lower the baking temperature in many cases.

However, as in the case of the present invention, to completely seal the SOG film using both of inorganic insulation films having favorable adhesiveness (silicon nitride films or silicon nitride oxide films having barrier characteristics being preferably used) is also extremely important in view of prevention of deterioration of the liquid crystal elements or the EL elements formed on the thin film transistors. Further, due to such a constitution, it is no more necessary to water permeability and water retentivity of the above-mentioned SOG film into consideration and hence, the complete sealing of SOG film is also extremely important in view of enhancing the stability of the operational performance of the thin film transistor.

Subsequently, the method of manufacturing the above-mentioned thin film transistor having the constitution shown in FIGS. 1A–B is explained in conjunction with FIGS. 2A–E. First of all, the method is explained in conjunction with FIG. 2A. A background film 102 is formed on the substrate 101 and a semiconductor film processed in an island shape by etching is formed on the background film 102. Then, a gate insulation film 106 is formed on the semiconductor film. A gate electrode 107 is formed on the gate insulation film 106. A source region 103 and a drain region 104 are formed in a self-aligning manner using the gate electrode 107 as a mask. Here, a channel forming region 105 is defined simultaneously. When the source region 103 and the drain region 104 are formed, the source region 103 and the drain region 104 are activated by heat treatment. Further, after forming the first passivation film 108, the hydrogenation processing is performed by heat treatment. The above-described steps of this manufacturing method may be performed using known techniques and any known material can be used as a material which constitutes the thin film transistor.

Figure 4A:
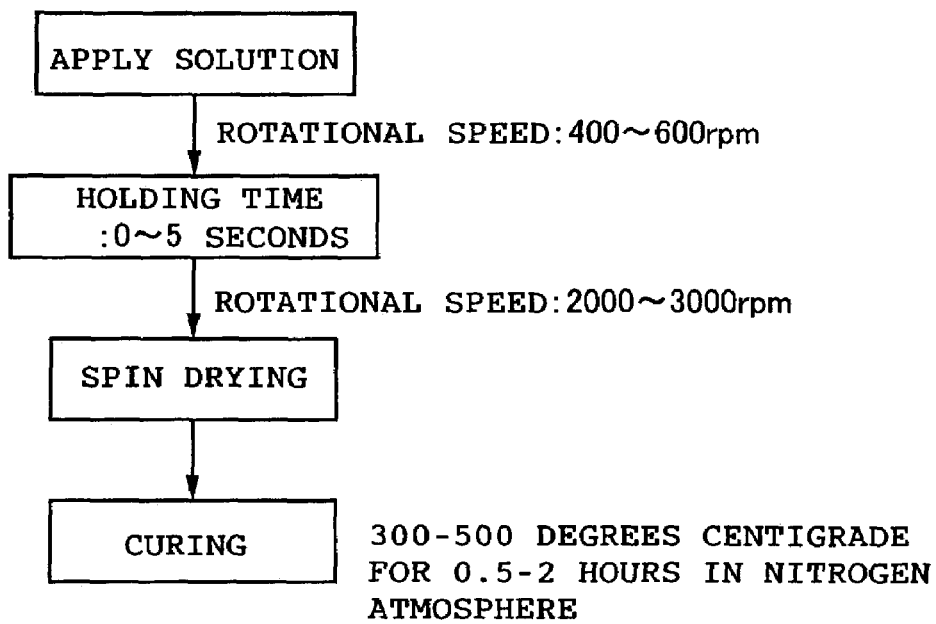
FIG. 4A and FIG. 4B are views showing process charts for forming an SOG film.
Figure 4B:
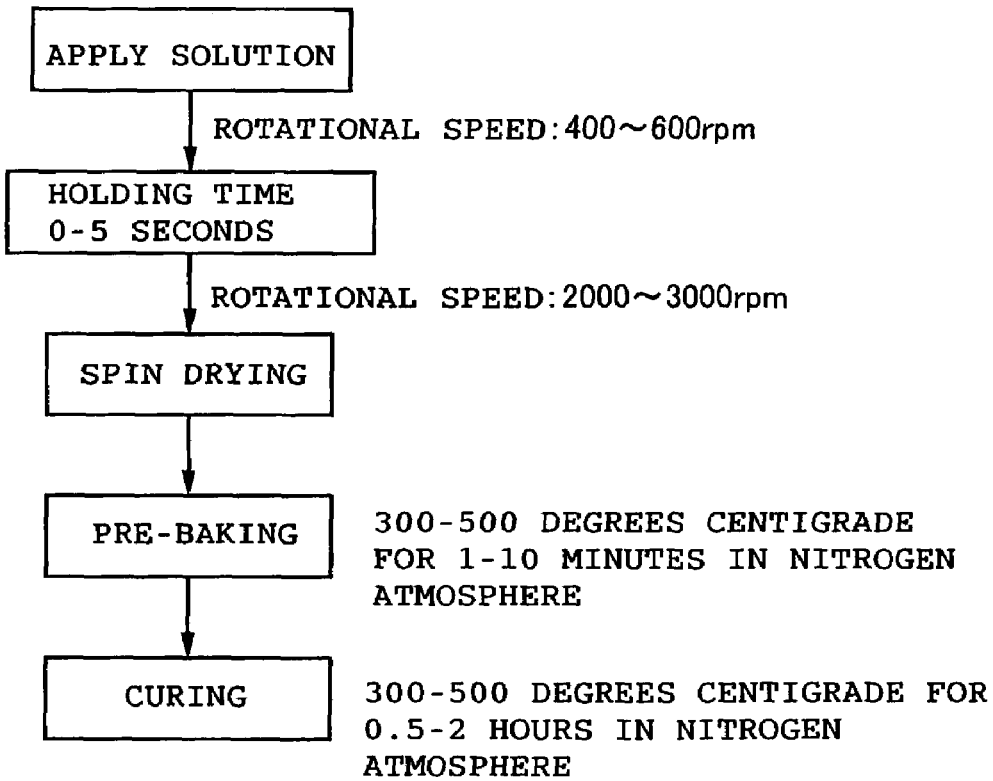

Then, the SOG film is formed as a leveling film 109. In this embodiment, the SOG film is formed in accordance with a flow chart shown in FIG. 4A or FIG. 4B. However, conditions described here are general conditions and the formation of the SOG film is not limited to such conditions. Usually, in view of the fact-that a crack may occur in the film when baking is performed suddenly at a high temperature, as shown in FIG. 4B, it is preferable to perform pre-baking before a baking step. A rotational speed and other conditions may be set by taking a required film thickness into consideration. Here, in the baking step, to prevent the adhesion or absorption of moisture or oxygen into the SOG film, it is preferable to perform heating in an inactive atmosphere (a nitrogen atmosphere or a rare gas atmosphere). It is preferable that the same deliberation is paid also with respect to the pre-baking step.

Figure 2A:
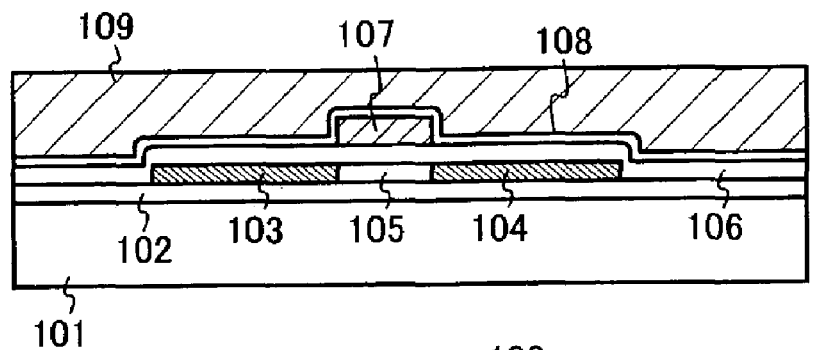
FIGS. 2A–E are views showing manufacturing steps of the thin film transistor.
Figure 2B:
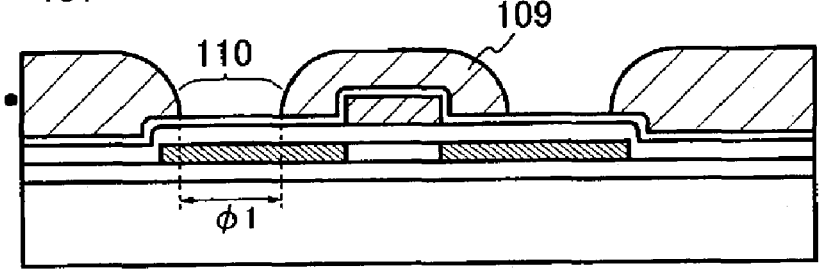

Subsequently, the explanation is made with respect to FIG. 2B. After forming the leveling film 109, the leveling film 109 is etched by patterning so as to form first opening portions 110. As an etching means, it is preferable to use a wet etching method which is free from a problem on plasma damage. However, a dry etching method may be also used. In this case, a diameter of the first opening portion 110 is set to $\phi1$.

Figure 2C:
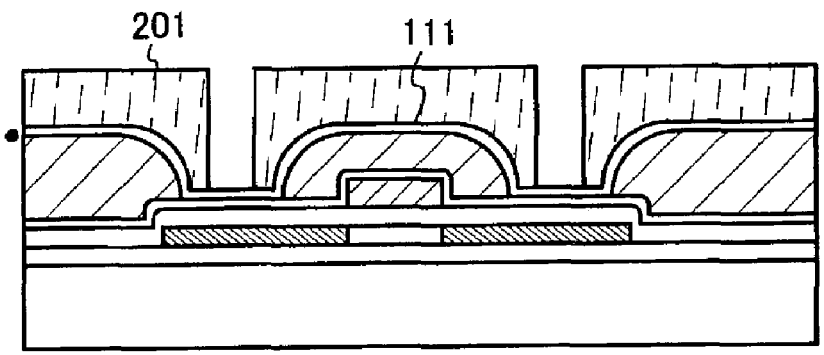

Then, the explanation is made with respect to FIG. 2C. After forming the first opening portions 110, a second passivation film 111 is formed such that the second passivation film 111 covers an upper surface of the leveling film 109 and inner wall surfaces of the first opening portions 110. The second passivation film 111 is made of a material equal to a material of the first passivation film 108. The second passivation film 111 is formed either by the plasma CVD method or the sputtering method. Then, when the second passivation film 111 is formed, a photo resist 201 is formed. This photo resist 201 constitutes a mask for forming second opening portions 112 in the second passivation film 111.

Figure 2D:
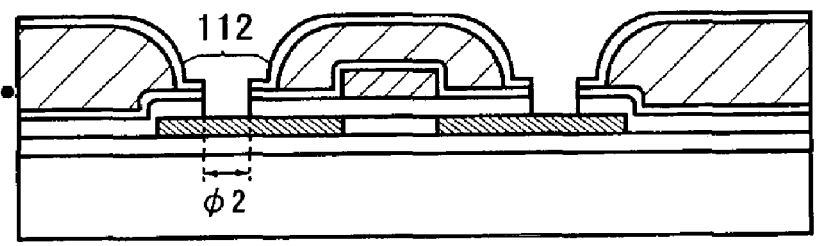

Subsequently, the explanation is made with respect to FIG. 2D. After forming the photo resist 201, etching processing is performed so as to sequentially etch the second passivation film 111, the first passivation film 108 and the gate insulation film 106 thus forming the second opening portions 112. Here, although either dry etching processing or wet etching processing may be adopted as the etching processing, it is preferable to adopt the dry etching processing to make the second opening portions 112 have a favorable shape. In this embodiment, the leveling film 109 is sealed by the first passivation film 108 and the second passivation film 111 and hence, whatever etching means is adopted, there is no possibility that the etching means will give an adverse influence to succeeding steps. In this manner, one of the features of the present invention lies in a point that while protecting the inner wall surfaces of the opening portions formed in the leveling film using a nitride insulation film such as a silicon nitride film or the like, the opening portions having further smaller diameter can be formed in bottom surfaces of the opening portions.

Further, in forming the second opening portions 112 by dry etching processing, the gate insulation film 106 and the first passivation film 108 are etched. It is possible to enhance the productivity by combining this etching with an inorganic insulation film. That is, by using a silicon nitride film as the first passivation film 108 and a silicon oxide nitride film as the gate insulation film 106, it is possible to allow the gate insulation film 106 to function as an etching stopper at the time of etching the first passivation film 108 and to allow the source region (silicon film) 103 to function as an etching stopper at the time of etching the gate insulation film 106.

For example, assume a case in which the oxide nitride silicon film is used as a gate insulation film 106 and a silicon nitride film is used as the first passivation film 108. Although the silicon nitride film which functions as the first passivation film 108 can be etched using tetrafluoro carbon ($CF_4$) gas, helium (He) gas and oxygen ($O_2$) gas, these gases also etch the silicon film. However, the silicon oxide nitride film which functions as the background gate insulation film 106 works as the etching stopper and hence, there is no possibility that the silicon film which functions as the source region 103 is dissipated. Further, the gate insulation film (here, silicon oxide nitride film) 106 can be etched using a trifluoro hydrocarbon ($CHF_3$) gas, while the silicon film is hardly etched. Accordingly, it is possible to allow the source region 103 to function as the etching stopper.

Figure 2E:
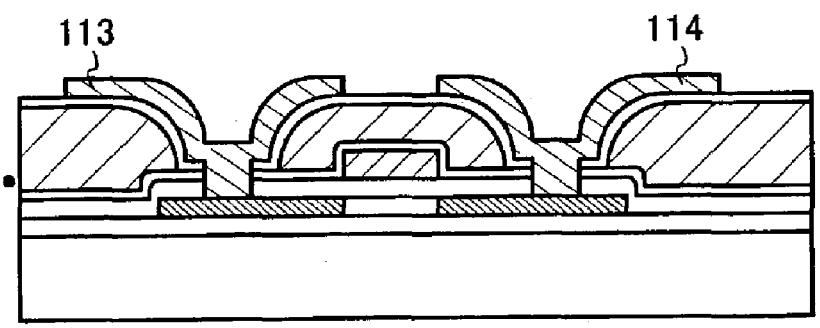

Then, the explanation is made with respect to FIG. 2E. After forming the second opening portions 112, a metal film is formed on the second opening portions 112 and, thereafter, the metal film is patterned by etching so as to form the source electrode 113 and the drain electrode 114. To form these electrodes, a titanium film, a titanium nitride film, a tungsten film (including alloy thereof) and an aluminum film (including alloy thereof) or a laminated film consisting of these films may be preferably used.

Due to the above-mentioned steps, it is possible to obtain the thin film transistor having the structure which is explained in conjunction with FIG. 1A and FIG. 1B. The thin film transistor obtained in this manner has the SOG film as an interlayer insulation film and, at the same time, the SOG film also functions as a leveling film. Further, since the SOG film is sealed by the nitride insulation film (typically silicon nitride film or silicon nitride oxide film), there arises no problem attributed to degassing.

As described above, in manufacturing the display device using the thin film transistors, by using the inorganic insulation film (SOG film) which is formed by the spin coating method as the leveling film and by adopting the contact structure shown in FIG. 1A and FIG. 1B, problems on water permeability and water retentivity of the SOG film can be resolved and hence, the enhancement of the stability of operational performance of the display device can be achieved.

Embodiment 1

In this embodiment, an example in which the formation position of the first opening portion 110 is changed in FIGS. 1A and 1B will be described using FIGS. 3A and 3B. Note that FIGS. 3A and 3B each show a cross sectional structure immediately after the formation of the second opening portion. In addition, the reference symbols used in FIGS. 1A and 1B are used to describe if necessary.

Figure 3A:
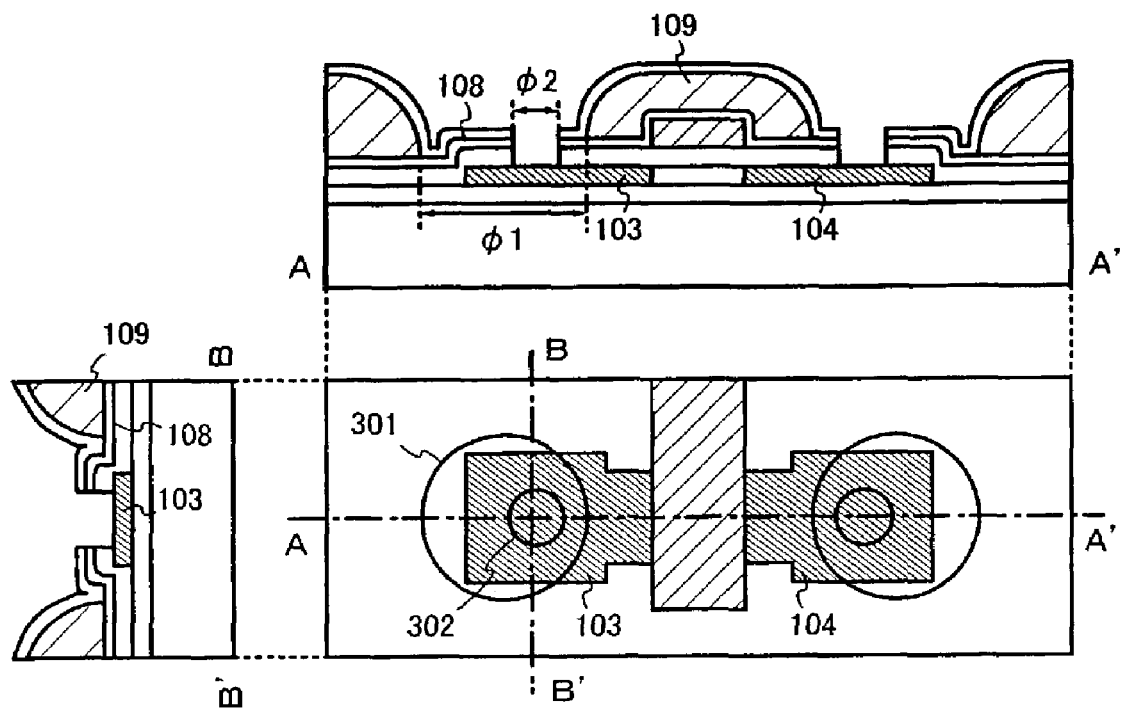
FIG. 3A and FIG. 3B are views showing the structure of a thin film transistor.
Figure 3B:
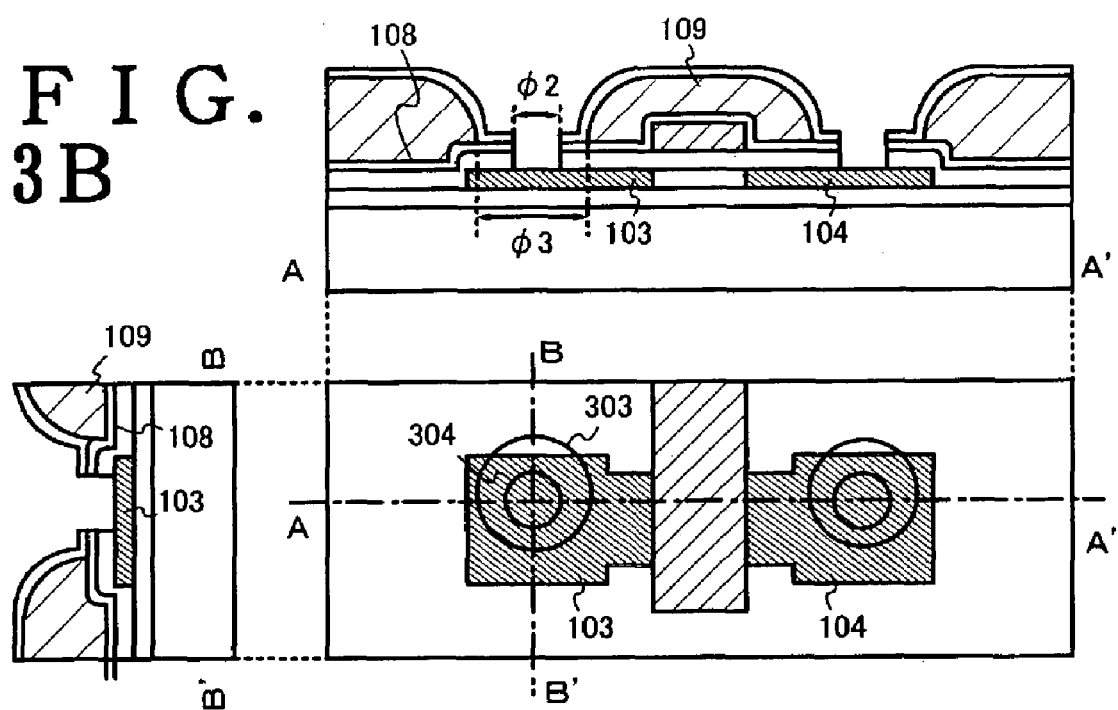

In FIG. 3A, reference numeral 301 denotes a first opening portion having a diameter of φ1 and 302 denotes a second opening portion having a diameter of φ2. A characteristic in FIG. 3A is that the first opening portion 301 is provided to protrude from the end portion of the source region 103. The SOG film 109 can be formed in a position as indicated in this embodiment because the first passivation film 108 becomes an etching stopper, thereby stopping the progress of etching. In addition, in FIG. 3B, reference numeral 303 denotes a first opening portion having a diameter of φ3 and 304 denotes a second opening portion having a diameter of φ2. A characteristic in FIG. 3B is also that the first opening portion 303 is provided to protrude from the side end portion of the source region 103. Even in this case, with respect to the SOG film 109, the first passivation film 108 becomes an etching stopper, thereby stopping the progress of etching.

As described above, the inorganic insulating film which can become an etching stopper is located under the SOG film used as the planarizing film. Thus, even when the diameter of the first opening portion is increased, there is no problem, so that it is very useful because a design margin in the formation of the contact hole can be widened.

Embodiment 2

In this embodiment, an example in which the present invention is applied to a light emitting device such as an EL display device will be described. FIG. 5A is a top surface view of a pixel of the light emitting device (note that a state up to the formation of a pixel electrode is indicated), FIG. 5B is a circuit diagram thereof, arid FIGS. 5C and 5D each are a cross sectional view along a line A–A' or B–B'.

As shown in FIGS. 5A and 5B, a display portion of the light emitting device includes a plurality of pixels which are surrounded by gate wirings 551, data wirings 552, and power source wirings (wirings for supplying a constant voltage or a constant current) 553 and arranged in matrix. In each of the pixels, a TFT 554 serving as a switching element (hereinafter referred to as a switching TFT), a TFT 555 serving as means for supplying a current or a voltage for producing light emission of an EL element (hereinafter referred to as a driver TFT), a capacitor portion 556, and an EL element 557 are provided. Although not shown here, the EL element 557 can be formed by providing a light emitting layer over a pixel electrode 558.

Note that, in this embodiment, an n-channel TFT having a multi-gate structure is used as the switching TFT 554 and a p-channel TFT is used as the driver TFT 555. However, it is not required that the pixel structure of the light emitting device is limited to this. Thus, the present invention can be applied to various known structures.

In the cross sectional view of FIG. 5C, the n-channel TFT 554 and the capacitor portion 556 are shown. Reference numeral 501 denotes a substrate, and a glass substrate, a ceramic substrate, a quartz substrate, a silicon substrate, or a plastic substrate (including a plastic film) can be used. In addition, reference numeral 502 denotes a silicon nitride oxide film, 503 denotes a silicon oxynitride film, and they are laminated to serve as base films. Of course, it is not required that the present invention is limited to these materials. Further, an active layer of the n-channel TFT 554 is provided on the silicon oxynitride film 503. The active layer has a source region 504, a drain region 505, LDD regions 506a to 506d, and channel formation regions 507a and 507b. In other words, it has two channel formation regions and four LDD regions between the source region 504 and the drain region 505.

Also, the active layer of the n-channel TFT 554 is covered with a gate insulating film 508, and a gate electrodes 509a and 509b and another gate electrodes 510a and 510b are provided thereon. In this embodiment, a silicon oxynitride film is used as the gate insulating film 508. When the above nitride insulating film such as an aluminum nitride film having a high relative dielectric constant is used, an occupying area of an element can be reduced. Thus, it is effective for the improvement of the scale of integration.

Also, a tantalum nitride film is used for the gate electrodes 509a and 510a and a tungsten film is used for the gate electrodes 509b and 510b. With respect to these metallic films, a selection ratio is high. Thus, the structure as shown in FIG. 5B can be obtained by selecting an etching condition. The etching condition is preferably referred to JP 2001-313397 A according to the present applicant.

Also, a silicon nitride film or a silicon nitride oxide film is provided as a first passivation film 511 covering the gate electrodes, and a SOG film 512 is provided thereon. Further, a second passivation film 513 is provided on the SOG film 512 so as to cover a first opening portion (see FIG. 1A). A second opening portion (see FIG. 1A) is provided to the bottom of the first opening portion. In this embodiment, a silicon nitride film or a silicon nitride oxide film is used as the second passivation film 513. Of course, another nitride insulating film such as an aluminum nitride film or an aluminum nitric oxide film can be also used.

Also, the data wiring 552 is connected with the source region 504 through the first opening portion, and a connection wiring 515 is connected with the drain region 505 through the second opening portion. The connection wiring 515 is a wiring connected to a gate electrode of the driver TFT 555. A structure in which a wiring containing mainly low resistance metal such as aluminum or copper is sandwiched by other metallic films or an alloy film of these metals is preferably used for the data wiring 552 and the connection wiring 515.

Also, reference numeral 516 denotes a source region of the driver TFT 555, with which the power source wiring 553 is connected. In a contact portion for this connection, the first opening portion and the second opening portion are formed by carrying out the present invention. In addition, the power source wiring 553 is opposite to a gate wiring 517 of the driver TFT 555 through the first passivation film 511 and the second passivation film 513, so that a storage capacitor 556a is formed. Further, the gate wiring 517 is opposite to a semiconductor film 518 through the gate insulating film 508 so that a storage capacitor 556b is formed. Because the power source wiring 553 is connected with a semiconductor layer 519, a charge is supplied therefrom, so that the semiconductor film 518 serves as an electrode. Thus, the capacitor portion 556 becomes a structure in which the storage capacitors 556a and 556b are connected in parallel, thereby obtaining a large capacity with a very small area. Furthermore, with respect to particularly the storage capacitor 556a, a silicon nitride film having a high relative dielectric constant is used for dielectric, so that a large capacity can be ensured. Because the dielectric of the storage capacity 556a is composed of a laminate structure of the first passivation film 511 and the second passivation film 513, a probability of occurrence of a pinhole is extremely low. Thus, a capacitor with high reliability can be formed.

When the present invention is carried out, the number of masks used in a photolithography process is increased to form the second opening portion as compared with a conventional case. However, when the increase in the number of masks is advantageously used, a new storage capacitor can be formed as described in this embodiment. Such a point is also one of important characteristics of the present invention. The characteristic of the present invention more than compensates for a demerit resulting from the increase in the number of masks, so that it greatly contributes to industrial progress. For example, when high definition image display is obtained, it is required that a relative occupying area of the storage capacitor to an area of each pixel is reduced in a display portion to improve an aperture ratio. Therefore, it is extremely useful to increase a storage capacity.

Also, in FIG. 5D, reference numeral 520 denotes a drain region of the driver TFT 555, which is connected with a drain wiring 521. The drain wiring 521 is connected with a pixel electrode 558 to compose a pixel. In this embodiment, an oxide conductive film which is transparent with respect to visible light (typically, an ITO film) is used as the pixel electrode 558. However, the present invention is not limited to such a film.

Figure 6A:
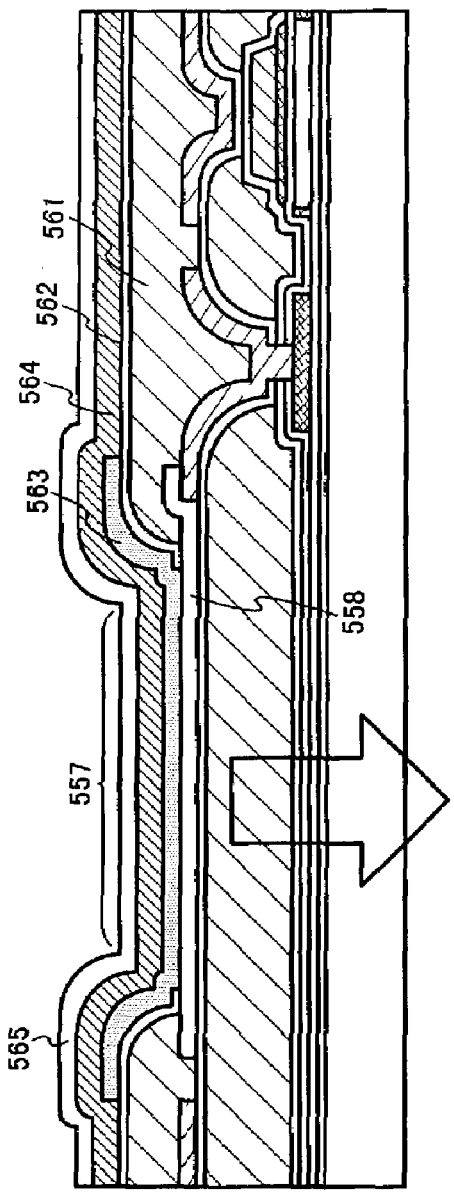
FIG. 6A and FIG. 6B are views showing the cross-sectional structure of the light emitting device.
Figure 6B:
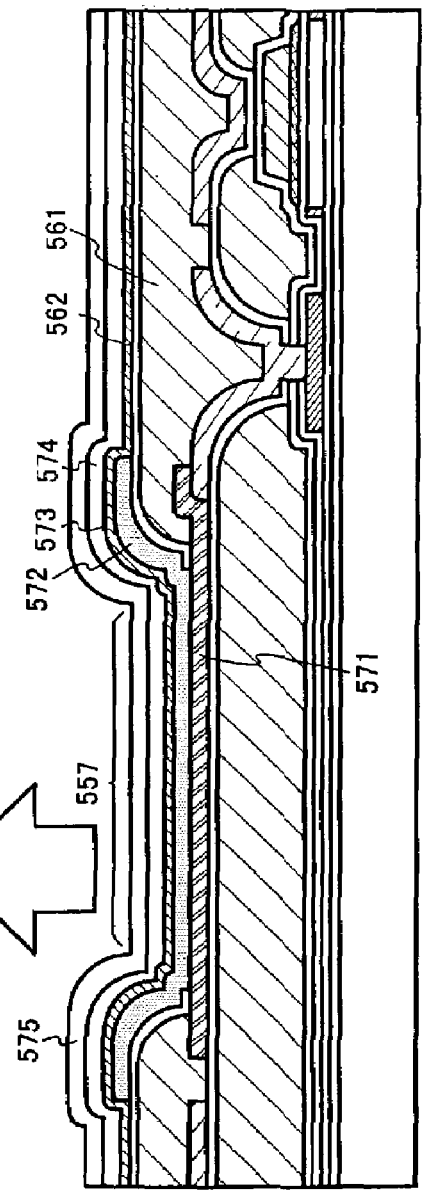

An example after an EL element is actually formed in the light emitting device having the above pixel structure is shown in FIGS. 6A and 6B. FIG. 6A is a cross sectional view corresponding to the cross section shown in FIG. 5D and shows a state in which the EL element 557 is formed on the pixel electrode 558. Note that, when the structure shown in FIG. 6A is used, the pixel electrode 558 corresponds of the anode of the EL element 557. In addition, in this specification, an EL element indicates an element in which an EL layer is provided between a cathode and an anode and a voltage is applied to the EL layer or a current is injected thereto to emit light.

The end portion of the pixel electrode 558 is covered with a photosensitive organic resin film 561. The photosensitive organic resin film 561 is provided in a grid shape so as to frame each pixel or provided in a stripe shape in row unit or column unit. In any case, when it is formed on the contact hole, a concave portion can be efficiently embedded and the entire surface can be also leveled. The photosensitive organic resin film 561 may be either the positive type or the negative type. Further, a known resist material (polymer material containing chromophore) can be also used.

Also, the surface of the photosensitive organic resin film 561 is covered with a nitride insulating film as a third passivation film 562, so that degassing from the photosensitive organic resin film 561 can be suppressed. In addition, the third passivation film 562 is etched on the pixel electrode 558 to provide an opening portion. In the opening portion, an EL layer 563 is in contact with the pixel electrode 558. The EL layer 563 is generally composed by laminating thin films such as a light emitting layer, a charge injecting layer, and a charge transporting layer. However, various structures and various materials in which light emission has been observed can be used. For example, SAlq (in which one of three ligands of $Alq_3$ is substituted for a triphenylsilanol structure) as an organic system material containing silicon can be also used as a charge transporting layer or a hole blocking layer.

Of course, the EL layer is not necessarily composed of only organic thin film, and a structure in which an organic thin film and an inorganic thin film are laminated may be also used. A polymer thin film or a low molecular thin film may be used. In addition, a forming method is changed according to whether a polymer thin film or a low molecular thin film is used. However, the thin film is preferably formed by a known method.

Also, a cathode 564 is formed on the EL layer 563, and a nitride insulating film as a fourth passivation film 565 is finally provided thereon. A metallic thin film containing an element belonging to group 1 or 2 of the periodic table is preferably used as the cathode 564. A metallic film in which lithium of 0.2 wt % to 1.5 wt % (preferably, 0.5 wt % to 1.0 wt %) is added to aluminum is suitable in view of a charge injecting property and the like. Note that, if lithium is diffused, it is concerned that the operation of a TFT is influenced thereby. However, according to this embodiment, the TFT is completely protected by the first passivation film 511, the second passivation film 513, and the third passivation film 562, so that it is unnecessary to concern the diffusion of lithium.

Figure 7A:
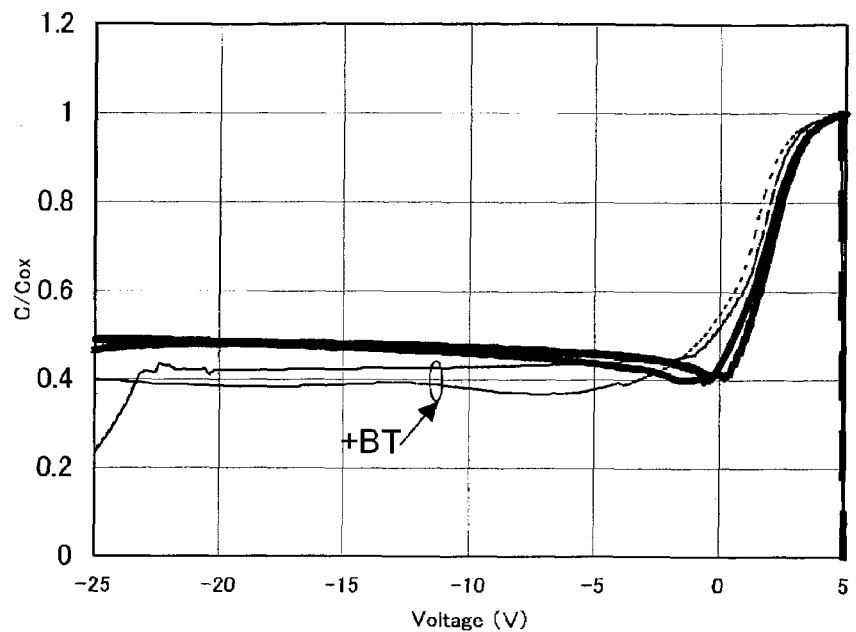
FIG. 7A and FIG. 7B are views showing C-V characteristics of the MOS structure which uses a silicon nitride film as a dielectric.
Figure 7B:
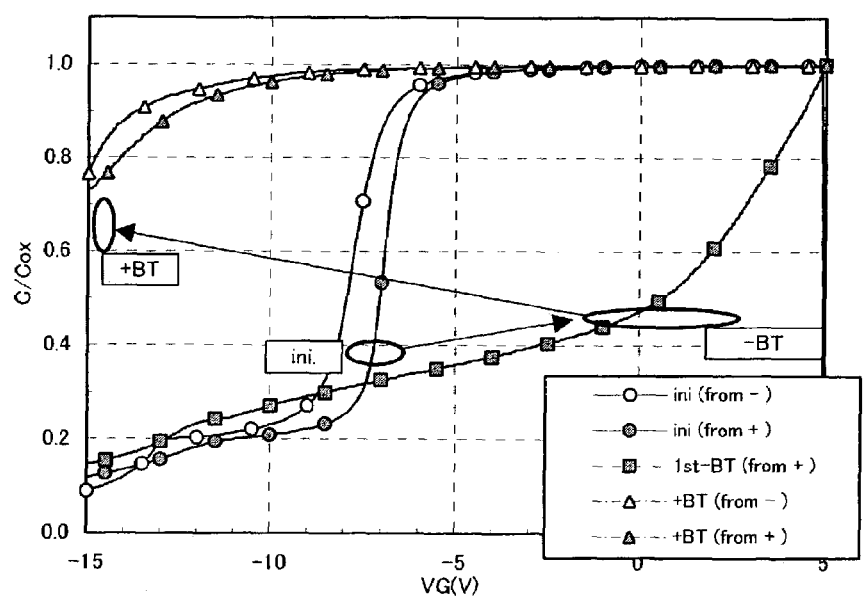

Here, data indicating a blocking effect of a silicon nitride film formed by a sputtering method using high frequency discharge with respect to lithium are shown in FIGS. 7A and 7B. FIG. 7A shows a C-V characteristic of an MOS structure in the case where a silicon nitride film formed by a sputtering method using high frequency discharge (indicated as RF-SP SiN) is used as dielectric. Note that "Li-dip" means that a solution containing lithium is spin-coated on the silicon nitride film and means that contamination is intentionally caused using lithium for a test. In addition, FIG. 7B shows a C-V characteristic of an MOS structure in the comparative case where a silicon nitride film formed by a plasma CVD method (indicated as CVD SiN) is used as dielectric. Note that, with respect to data shown in FIG. 7B, an alloy film in which lithium is added to aluminum is used as a metallic electrode. A general BT test is conducted for these films (specifically, heat treatment is conducted at ±150° C. for 1 hour in addition to the application of a voltage of 1.7 MV). As a result, as shown in FIG. 7A, a change in C-V characteristic in the case where the silicon nitride film formed by the sputtering method using high frequency discharge is hardly observed. On the other hand, a large change in C-V characteristic in the case where the silicon nitride film formed by the plasma CVD method is observed. Accordingly, contamination of lithium is recognized. These data suggest that the silicon nitride film formed by the sputtering method using high frequency discharge has a very effective blocking effect to lithium diffusion.

Further, when a nitride insulating film is used as the second passivation film 513 or the third passivation film 562, a heat radiation effect can be expected. For example, if it is assumed that a thermal conductivity of a silicon oxide film is 1, that of a silicon nitride film is about 5 and that of an aluminum nitride film is about 35 to 130, thereby obtaining a very high thermal conductivity. Thus, even when the EL element generates heat, heat is effectively radiated, so that the deterioration of the EL layer 563 resulting from self heat radiation can be suppressed.

Note that the same material as the nitride insulating film used for the first passivation film 511 and the second passivation film 513 can be used for the third passivation film 562 and the fourth passivation film 565.

When the structure shown in FIG. 6A is used, light emitted from the EL element transmits the pixel electrode 558 and exits from the substrate 501 side. At this time, the SOG film 512 is transparent to light, so that light generated at the EL device is transmitted through the film without a problem.

Next, FIG. 6B shows an example in which a metallic film 571 having a reflecting property is used instead of the pixel electrode 558. As the metallic film 571 having the reflecting property, a film of metal such as platinum (Pt) or gold (Au) having a high work function is used to serve as an anode. In addition, because such a metal is expensive, it may be laminated on a suitable metallic film such as an aluminum film or a tungsten film to form a pixel electrode in which at least platinum or gold is exposed onto an uppermost surface. Reference numeral 572 denotes an EL layer, and various structures and various materials in which light emission has been observed can be used as in the case shown in FIG. 6A. In addition, reference numeral 573 denotes a metallic film having a small film thickness (preferably, 10 nm to 50 nm). A metallic film containing an element belonging to group 1 or 2 of the periodic table is used to serve as a cathode. Further, an oxide conductive film (typically, an ITO film) 574 is provided by laminating it on the metallic film 573 and a fourth passivation film 575 is provided thereon.

When the structure shown in FIG. 6B is used, light emitted from the EL element is reflected by the pixel electrode 571, transmits through the metallic film 573, the oxide conductive film 574, and the like, and exits from the substrate. At this time, because the light does not transmit through a portion under the pixel electrode 571, a memory element, a resistor element, or the like may be provided therein and the photosensitive organic resin film 561 may be colored. Thus, a degree of flexibility in a design is high and a manufacturing process can be also simplified. Therefore, it can be said that the structure generally contributes to a reduction in manufacturing cost.

Embodiment 3

In this embodiment, an example is indicated in which a connection structure between the drain wiring 521 and the pixel electrode 558 is modified in the light emitting device described in Embodiment 2. Note that the fundamental structure is not changed as compared with that shown in FIG. 5C. Thus, in this embodiment, reference symbols are provided to only necessary portions and the description will be made.

As shown in FIG. 8A, a pixel electrode 801 made from an oxide conductive film is formed and then a drain wiring 802 is formed, so that a structure in which the drain wiring 802 is in contact with the pixel electrode 801 so as to cover the end portion thereof is obtained. When such a structure is obtained, the pixel electrode 801 may be formed after the formation of a second opening portion 803. Alternatively, the second opening portion 803 may be formed after the formation of the pixel electrode 801. In any case, even when dry etching processing is conducted, the SOG film 512 is always protected by the second passivation film 513 from plasma damage. Thus, there is no case where electrical characteristics of an EL layer and a thin film transistor are adversely influenced.

Next, as shown in FIG. 8B, an interlayer insulating film 804 made from an inorganic insulating film is provided on the first passivation film 511, and a drain wiring 805 is provided thereon. A connection wiring 806 is formed simultaneous with the drain wiring. The connection wiring 806 is connected with a capacitor wiring 517 of a lower layer. The drain wiring 805 and the connection wiring 806 are covered with a SOG film 807 having a first opening portion 808. The first opening portion 808 is covered with a second passivation film 809 made from a nitride insulating film. The second passivation film 809 has a second opening portion 810 in the bottom of the first opening portion 808. A pixel electrode 811 made from an oxide conductive film are connected with the drain wiring 805 through the first opening portion 808 and the second opening portion 810.

In this time, a storage capacitor 812 which is composed of the connection wiring 806, the second passivation film 809, and the pixel electrode 811 is produced on the connection wiring 806. In the case of the structure shown in FIG. 8B, only the second passivation film 809 having a high relative dielectric constant is used as dielectric, so that a storage capacitor having a large capacitance value can be produced. Of course, a storage capacitor using the pixel electrode 811 and the capacitor wiring 517 as a pair of electrodes can be also produced. However, in this case, because the second passivation film 809, the interlayer insulating film 804, and the first passivation film 511 are used as dielectric, a capacitance value becomes lower than that in the structure shown in FIG. 8B.

Next, FIG. 8C shows an example in which a nitride insulating film 813 is provided as another passivation film after the formation of the drain wiring 805 and the connection wiring 806 in FIG. 8B. In such a case, a storage capacitor 814 is composed of the connection wiring 806, the nitride insulating film 813, the second passivation film 809, and the pixel electrode 811. In this case, the film thickness is increased as compared with that in FIG. 8B, thereby slightly reducing a capacitance value. However, when a laminate is used for dielectric, a problem related to a pinhole, and the like can be reduced, so that the reliability of the storage capacitor is improved.

As described above, the present invention is not limited to the structure described in Embodiment 2, and therefore may have applicability to various transistor structures using the SOG film as the planarizing film. Note that, in the structure described in this embodiment, the nitride insulating film described in Embodiments 1 and 2 above can be used for the second passivation film 809 and the nitride insulating film 813.

Embodiment 4

In this embodiment, an example in which a bottom gate thin film transistor (specifically, an inverse staggered TFT) is used as a thin film transistor in Embodiments 1 to 3 will be described. In other words, even when an inverse staggered TFT is used for the switching TFT and the driver TFT in Embodiment 2 or 3, the present invention can be carried out.

Figure 9:
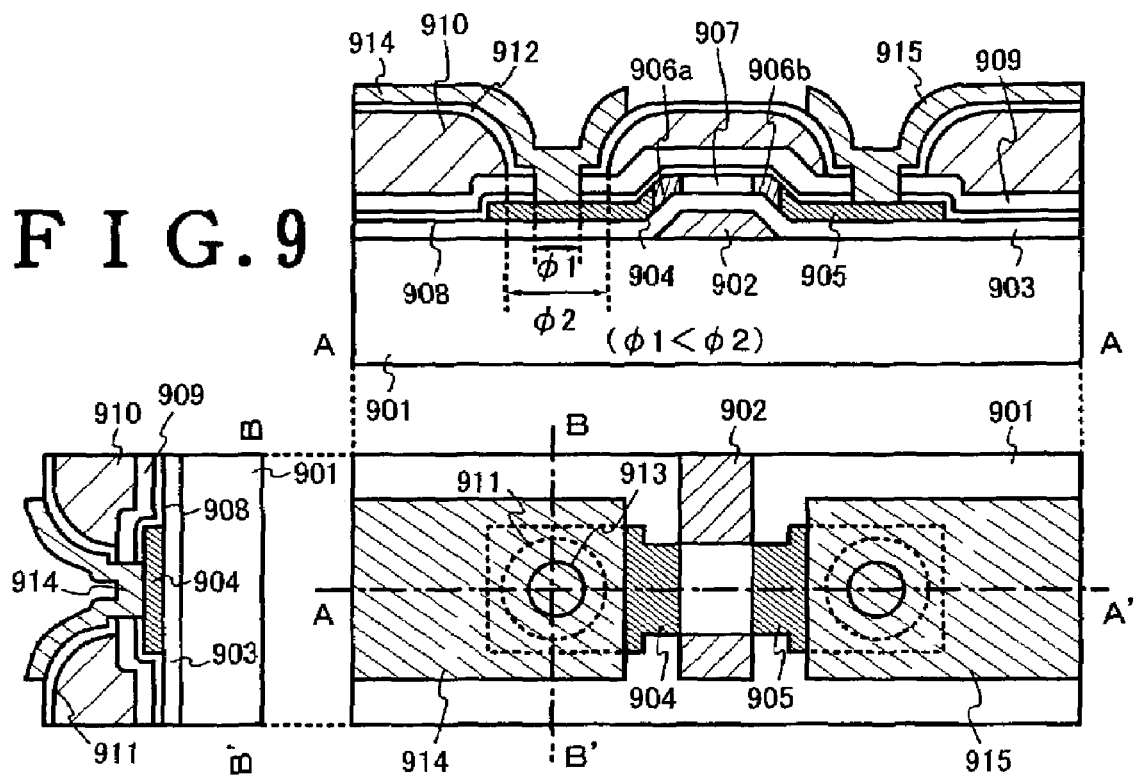
FIG. 9 is a view showing the structure of an inverse staggered type thin film transistor.

This embodiment will be described using FIG. 9. In FIG. 9A, reference numeral 901 denotes a substrate, 902 denotes a gate electrode, 903 denotes a gate insulating film, 904 denotes a source region, 905 denotes a drain region, 906a and 906b denote LDD regions, and 907 denotes a channel formation region. The source region, the drain region, the LDD regions, and the channel formation region are made from a semiconductor film provided on the gate insulating film 902 covering the gate electrode 902. In addition, reference numerals 908 and 909 denote inorganic insulating films. In this embodiment, 908 denotes a silicon oxide film and 909 denotes a silicon nitride film. The silicon nitride film 909 serves as a first passivation film. The silicon oxide film 908 serves as a buffer layer between a semiconductor layer which becomes a lower layer and the first passivation film 909 made of silicon nitride. A known thin film transistor structure is described up to here. Various known materials can be used for materials of respective portions.

Next, a SOG film, specifically, a SOG film is provided as a planarizing film 910 on the first passivation film 909. A first opening portion (indicated by a diameter of φ1) 911 is provided in the SOG film 910. Further, a second passivation film 912 made from an inorganic insulating film is provided so as to cover the top surface of the SOG film 910 and the inner wall surface of the first opening portion 911. A second opening portion (indicated by a diameter of φ2) 913 is provided in the second passivation film 912 in the bottom of the first opening portion 911. Reference numeral 914 denotes a source electrode and 915 denotes a drain electrode.

Even in this embodiment, as in Embodiment 1, a silicon nitride film, a silicon nitride oxide film, a silicon oxynitride film, an aluminum nitride film, an aluminum nitric oxide film, or an aluminum oxynitride film can be used for the first passivation film 909 and the second passivation film 912. In addition, a laminate film including one of these films in at least a portion thereof can be used. It is desirable that the diameter of φ1 is set to 2 μm to 10 μm (preferably, 3 μm to 5 μm) and the diameter of φ2 is set to 1 μm to 5 μm (preferably, 2 μm to 3 μm). It is preferable that a relationship of φ1>φ2 is satisfied.

As described above, when the present invention is carried out, the structure of a thin film transistor is not necessarily limited to only a top gate type or only a bottom gate type. Thus, the present invention can be applied to a thin film transistor having any structure. Further, the present invention is not necessarily limited to a thin film transistor, and may be applied to a transistor having a MOS structure which is formed using a silicon well.

Embodiment 5

Figure 10A:
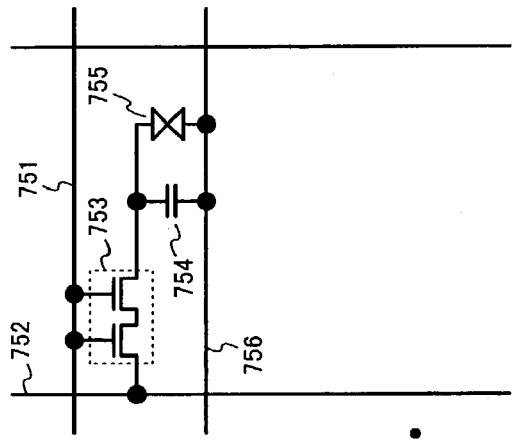
FIGS. 10A–D are views showing the constitution of the pixel of the liquid crystal display device.

In this embodiment, an example in which the present invention is applied to a liquid crystal display device will be described. FIG. 10A is a top surface view of a pixel of a liquid crystal display device (note that a state up to the formation of a pixel electrode is indicated), FIG. 10B is a circuit diagram thereof, and FIGS. 10C and 10D each are a cross sectional view along a line A–A' or B–B'.

Figure 10B:
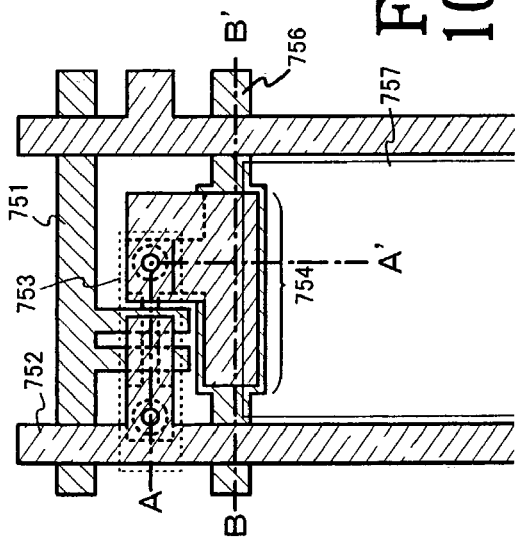

As shown in FIGS. 10A and 10B, a display portion of the liquid crystal display device includes a plurality of pixels which are surrounded by gate wirings 751 and data wirings 752 and arranged in matrix. In each of the pixels, a TFT 753 serving as a switching element (hereinafter referred to as a switching TFT), a capacitor portion 754, and a liquid crystal element 755 are provided. In the circuit shown in FIG. 10B, both the capacitor portion 754 and the liquid crystal element 755 are connected with a constant potential line 756. However, they are not necessarily kept to the same potential, i.e., one may be kept to a common potential and the other may be kept to a ground potential (earth potential). In addition, although not shown here, the liquid crystal element can be formed by providing a liquid crystal layer over a pixel electrode 757. Note that, although in this embodiment, an n-channel TFT having a multi-gate structure is used as the switching TFT 753, a p-channel TFT may alternatively be used. The layout of the switching TFT is preferably determined as appropriate by an operator.

Figure 10C:
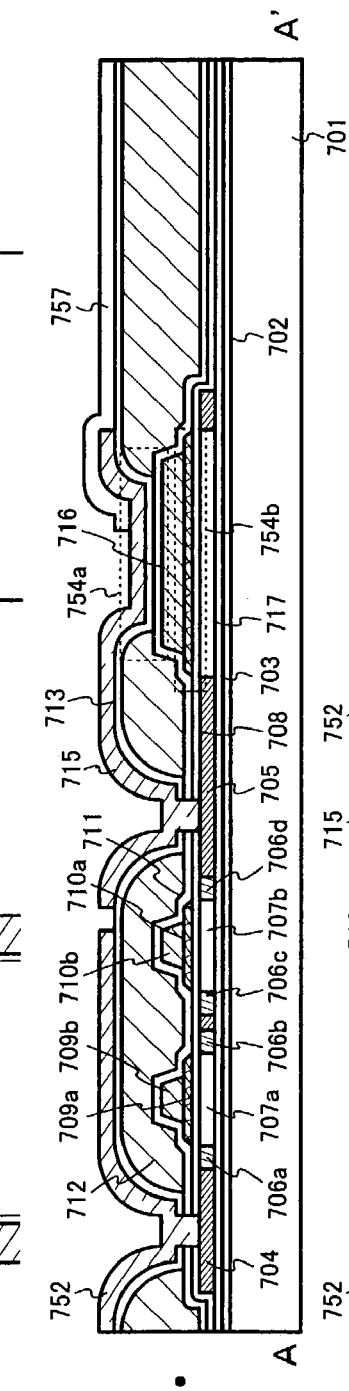
Figure 10D:
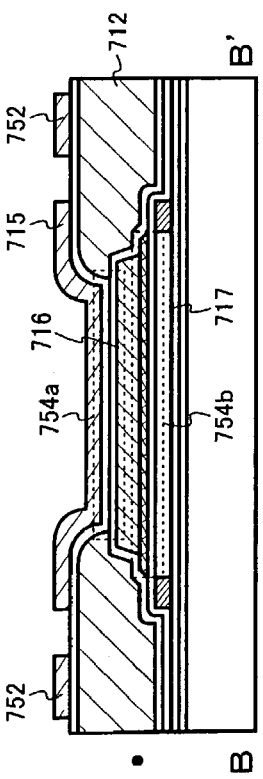

In the cross sectional view of FIG. 10C, the switching TFT 753 and the capacitor portion 754 are shown. Reference numeral 701 denotes a substrate, and a glass substrate, a ceramic substrate, a quartz substrate, a silicon substrate, or a plastic substrate (including a plastic film) can be used. In addition, reference numeral 702 denotes a silicon nitride oxide film, 703 denotes a silicon oxynitride film, and they are laminated to serve as base films. Of course, the present invention is not necessarily limited to these materials. Further, an active layer of the switching TFT 753 is provided on the silicon oxynitride film 703. The active layer has a source region 704, a drain region 705, LDD regions 706*a* to 706*d*, and channel formation regions 707*a* and 707*b*. In other words, it has two channel formation regions and four LDD regions between the source region 704 and the drain region 705.

Also, the active layer of the switching TFT 753 is covered with a gate insulating film 708, and a gate electrodes 709*a* and 709*b* and another gate electrodes 710*a* and 710*b* are provided thereon. In this embodiment, a silicon oxynitride film is used as the gate insulating film 708. In addition, a tantalum nitride film is used for the gate electrode 709*a* and 710*a* and a tungsten film is used for the gate electrode 709*b* and 710*b*. With respect to these metallic films, a selection ratio is high. Thus, the structure as shown in FIG. 10B can be obtained by selecting an etching condition. The etching condition may be referred to JP 2001-313397 A according to the present applicant.

Also, a silicon nitride film or a silicon nitride oxide film is provided as a first passivation film 711 covering the gate electrodes, and a SOG film 712 is provided thereon. Further, a second passivation film 713 is provided on the SOG film 712 so as to cover a first opening portion (see FIG. 1A). A second opening portion (see FIG. 1A) is provided to the bottom of the first opening portion. In this embodiment, a silicon nitride film or a silicon nitride oxide film is used as the second passivation film 713. Of course, another nitride insulating film such as an aluminum nitride film or an aluminum nitric oxide film can be also used.

Also, the data wiring 752 is connected with the source region 704 through the first opening portion, and the drain wiring 715 is connected with the drain region 705 through the second opening portion. The drain wiring 715 is used as an electrode composing a storage capacitor in the capacitor portion and electrically connected with the pixel electrode 757. Note that, in this embodiment, an oxide conductive film which is transparent with respect to visible light (typically, an ITO film) is used as the pixel electrode 757. However, the present invention is not limited to such a film. In addition, a structure in which a wiring containing mainly low resistance metal such as aluminum or copper is sandwiched by other metallic films or an alloy film of these metals is preferably used for the data wiring 752 and the drain wiring 715.

The drain wiring 715 is opposite to a capacitor wiring 716 which is formed together with the gate electrodes (that is, which is formed on the same surface as the gate electrodes) through the first passivation film 711 and the second passivation film 713, so that a storage capacitor 754*a* is produced. Further, the capacitor wiring 716 is opposite to a semiconductor film 717 through the gate insulating film 708 so that a storage capacitor 754*b* is produced. Because the semiconductor film 717 is electrically connected with the drain region 705, when a constant voltage is applied to the capacitor wiring 716, the semiconductor film serves as an electrode. Thus, the capacitor portion 754 becomes a structure in which the storage capacitors 754*a* and 754*b* are connected in parallel, thereby obtaining a large capacity with a very small area. Furthermore, with respect to particularly the storage capacitor 754*a*, a silicon nitride film having a high relative dielectric constant is used for dielectric, so that a large capacity can be ensured.

An example, up to the actual formation of a liquid crystal element of the liquid crystal display device having the above pixel structure is shown in FIGS. 11A and 11B. FIG. 11A is a cross sectional view corresponding to the cross section shown in FIG. 10C and shows a state in which the liquid crystal element 755 is formed on the pixel electrode 757. A spacer 721 made of an organic resin is provided on the drain wiring 715, and an alignment film 722 is provided thereon. The formation order of the spacer 721 and the alignment film 722 may be reverse. Further, a light shielding film 724 made from a metallic film, a counter electrode 725 made from an oxide conductive film, and an alignment film 726 are provided on another substrate (counter substrate) 723, and then the alignment film 722 and the alignment film 726 are bonded opposite to each other using a sealing material (not shown). Furthermore, a liquid crystal 727 is injected from a liquid crystal injection port provided in the sealing material, and the liquid crystal injection port is then sealed to complete the liquid crystal display device. Note that a general liquid crystal cell assembly process is preferably applied to a process after the formation of the spacer 721. Thus, the detailed description is not particularly made.

When the structure shown in FIG. 11A is used, light is made incident from the counter substrate 723 side, modulated through the liquid crystal 727, and exits from the substrate 701 side. At this time, the transmitting light transmits through the SOG film 712 used as the planarizing film. The SOG film 712 is transparent to visible light, so that light can be transmitted through the SOG film without a problem.

Next, FIG. 11B shows an example in which a drain wiring 731 made from a metallic film having a reflecting property is used without modification instead of the pixel electrode 757. As the metallic film having the reflecting property, an aluminum film (including an aluminum alloy film) or a conductive film having a silver thin film at least on its surface can be used. The description related to other portions for which the same reference symbols as in FIG. 11A are provided is omitted here. When the structure shown in FIG. 11B is used, light is made incident from the counter substrate 723 side, modulated through the liquid crystal 727, and outputted from the counter substrate 723 side again. At this time, because the light does not transmit through a portion under the drain wiring 731, a memory element, a resistor element, or the like may be provided therein. Thus, a degree of flexibility in a design is high and a manufacturing process can be also simplified. Therefore, it can be said that the structure generally contributes to a reduction in manufacturing cost.

Embodiment 6

Figure 12A:
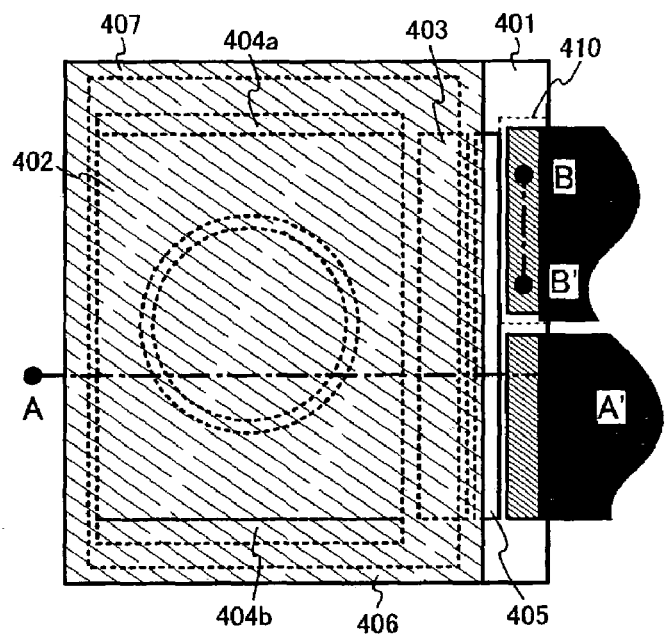
FIGS. 12A–D are views showing the appearance constitution of the light emitting device.
Figure 12B:
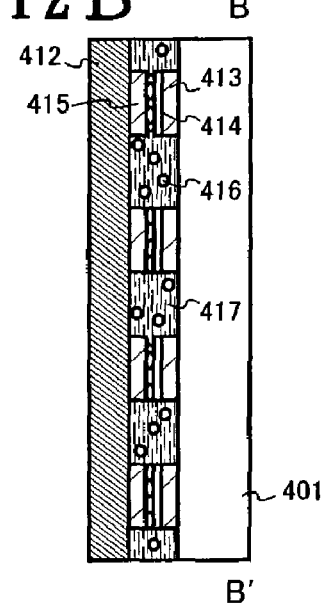
Figure 12C:
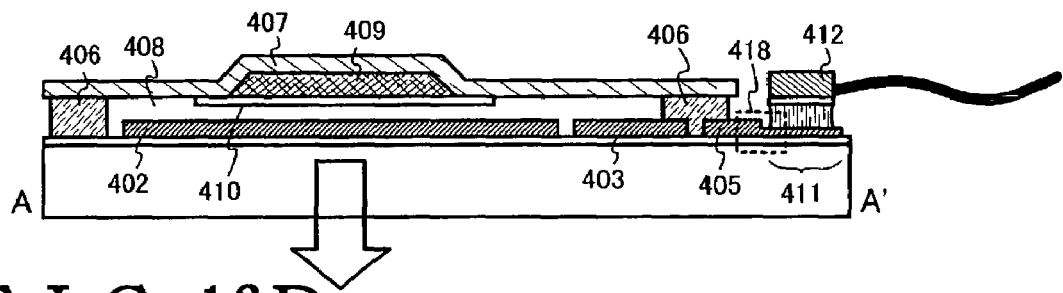

In this embodiment, a structure of the entire light emitting device shown in FIGS. 5A to 5D will be described using FIGS. 12A to 12D. FIG. 12A is a top surface view of a light emitting device produced by sealing an element substrate in which thin film transistors are formed with a sealing material. FIG. 12B is a cross sectional view along a line B–B' in FIG. 12A. FIG. 12C is a cross sectional view along a line A–A' in FIG. 12A.

A pixel portion (display portion) 402, a data line driver circuit 403, gate line driver circuits 404a and 404b, and a protective circuit 405, which are provided to surround the pixel portion 402, are located on a substrate 401, and a seal material 406 is provided to surround them. The structure of the pixel portion 402 preferably refers to FIGS. 6A and 6B and its description. As the seal material 406, a glass material, a metallic material (typically, a stainless material), a ceramic material, or a plastic material (including a plastic film) can be used. As shown in FIGS. 6A and 6B, it can be also sealed with only an insulating film. In addition, it is necessary to use a translucent material according to the radiation direction of light from an EL element.

The seal material 406 may be provided to partially overlap with the data line driver circuit 403, the gate line driver circuits 404a and 404b, and the protective circuit 405. A sealing material 407 is provided using the seal material 406, so that a closed space 408 is produced by the substrate 401, the seal material 406, and the sealing material 407. A hygroscopic agent (barium oxide, calcium oxide, or the like) 409 is provided in advance in a concave portion of the sealing material 407, so that it has a function of absorbing moisture, oxygen, and the like to keep an atmosphere clean in an inner portion of the above closed space 408, thereby suppressing the deterioration of an EL layer. The concave portion is covered with a cover material 410 with a fine mesh shape. The cover material 410 allows air and moisture to pass therethrough but not the hygroscopic agent 409. Note that the closed space 408 is preferably filled with a noble gas such as nitrogen or argon, and can be also filled with a resin or a liquid if it is inert.

Also, an input terminal portion 411 for transmitting signals to the data line driver circuit 403 and the gate line driver circuits 404a and 404b is provided on the substrate 401. Data signals such as video signals are transferred to the input terminal portion 411 through a FPC (flexible printed circuit) 412. With respect to a cross section of the input terminal portion 411, as shown in FIG. 12B, an input wiring having a structure in which an oxide conductive film 414 is laminated on a wiring 413 formed together with a gate wiring or a data wiring is electrically connected with a wiring 415 provided in the FPC 412 side through a resin 417 to which conductors 416 are dispersed. Note that a spherical polymer compound for which plating processing using gold or silver is conducted is preferably used for the conductors 416.

Figure 12D:
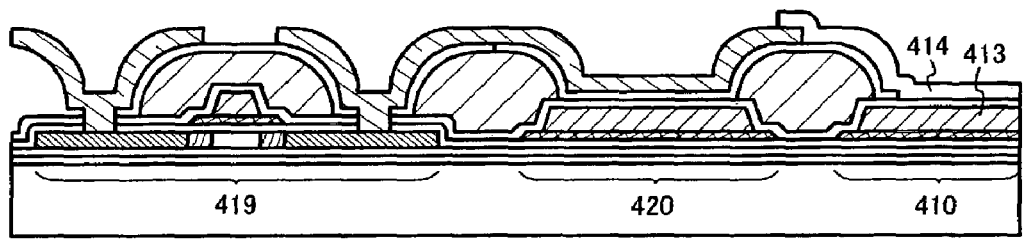

Also, an enlarged view of a region 418 surrounded by a dot line in FIG. 12C is shown in FIG. 12D. The protective circuit 405 is preferably composed by combining a thin film transistor 419 and a capacitor 420, and any known structure may be used therefor. The present invention has such a feature that the formation of the capacitor is possible without increasing the number of photolithography steps together with the improvement of contact holes. In this embodiment, the capacitor 420 is formed utilizing the feature. Note that the structure of the thin film transistor 419 and that of the capacitor 420 can be understood if FIGS. 6A and 6B and description thereof are referred to, and therefore the description is omitted here.

In this embodiment, the protective circuit 405 is provided between the input terminal portion 411 and the data line driver circuit 403. When an electrostatic signal such as an unexpected pulse signal is inputted therebetween, the protective circuit releases the pulse signal to the outside. At this time, first, a high voltage signal which is instantaneously inputted can be dulled by the capacitor 420, and other high voltages can be released to the outside through a circuit composed of a thin film transistor and a thin film diode. Of course, the protective circuit may be provided in other location, for example, a location between the pixel portion 402 and the data line driver circuit 403 or locations between the pixel portion 402 and the gate line driver circuits 404a and 404b.

As described above, according to this embodiment, when the present invention is carried out, an example in which the capacitor used for the protective circuit for electrostatic measures and the like which is provided in the input terminal portion is simultaneously formed is indicated. This embodiment can be carried out by being combined with any structure of Embodiments 1 to 5.

Embodiment 7

Examples of electronics employing a display apparatus of the present invention to a display portion are: a video camera; a digital camera; a goggle type display (head mounted display); a navigation system; an audio reproducing apparatus (car audio, an audio component, and the like); a laptop computer; a game machine; a portable information terminal (a mobile computer, a cellular phone, a portable game machine, an electronic book, etc.); and an image reproducing apparatus including a recording medium (specifically, an appliance capable of processing data in a recording medium such as a Digital Versatile Disk (DVD) and having a display apparatus that can display the image of the data). Specific examples of the electronics are shown in FIGS. 13A to 13H.

Figure 13A:
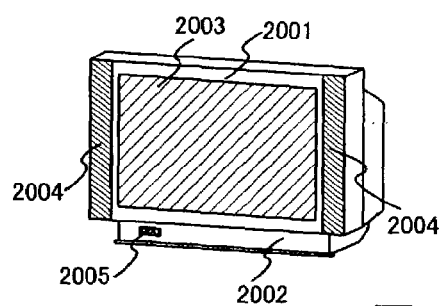
FIGS. 13A–H are views showing a specific example of an electric appliance.

FIG. 13A shows a television, which comprises a casing 2001, a supporting base 2002, a display unit 2003, speaker units 2004, a video input terminal 2005, etc. The present invention is applied to the display unit 2003. The term television includes every television for displaying information such as one for a personal computer, one for receiving TV broadcasting, and one for advertisement.

Figure 13B:
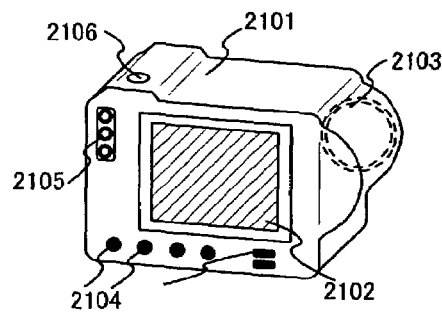

FIG. 13B shows a digital camera, which comprises a main body 2101, a display unit 2102, an image receiving unit 2103, operation keys 2104, an external connection port 2105, a shutter 2106, etc. The present invention is applied to the display unit 2102.

Figure 13C:
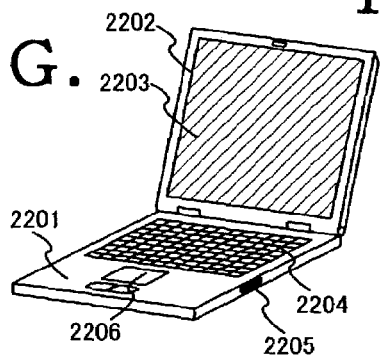

FIG. 13C shows a laptop computer, which comprises a main body 2201, a casing 2202, a display unit 2203, a keyboard 2204, an external connection port 2205, a pointing mouse 2206, etc. The present invention is applied to the display unit 2203.

Figure 13D:
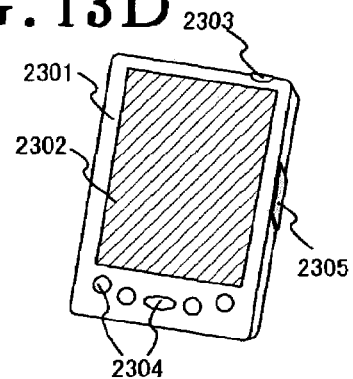

FIG. 13D shows a mobile computer, which comprises a main body 2301, a display unit 2302, a switch 2303, operation keys 2304, an infrared ray port 2305, etc. The present invention is applied to the display unit 2302.

Figure 13E:
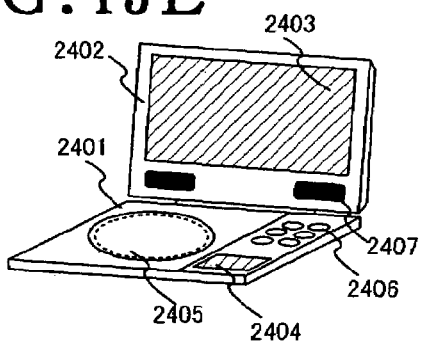

FIG. 13E shows a portable image reproducing apparatus equipped with a recording medium (a DVD player, to be specific). The apparatus comprises a main body 2401, a casing 2402, a display unit A 2403, a display unit B 2404, a recording medium (such as DVD) reading unit 2405, operation keys 2406, speaker units 2407, etc. The display unit A 2403 mainly displays image information whereas the display unit B 2404 mainly displays text information. The present invention is applied to the display units A 2403 and B 2404. The term image reproducing apparatus equipped with a recording medium includes domestic game machines.

Figure 13F:
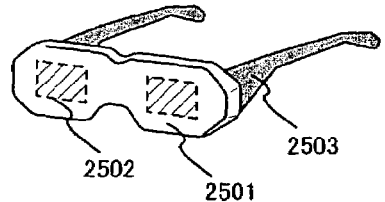

FIG. 13F shows a goggle type display (head mounted display), which comprises a main body 2501, display units 2502, and arm units 2503. The present invention is applied to the display unit 2502.

Figure 13G:
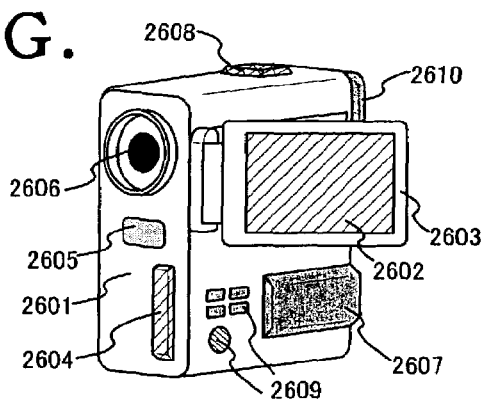

FIG. 13G shows a video camera, which comprises a main body 2601, a display unit 2602, a casing 2603, an external connection port 2604, a remote control receiving unit 2605, an image receiving unit 2606, a battery 2607, an audio input unit 2608, operation keys 2609, an eyepiece unit 2610,etc. The present invention is applied to the display portion 2602.

Figure 13H:
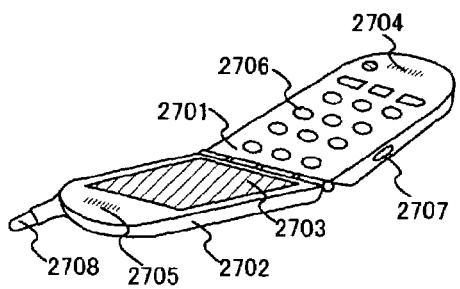

FIG. 13H shows a cellular phone, which comprises a main body 2701, a casing 2702, a display unit 2703, an audio input unit 2704, an audio output unit 2705, operation keys 2706, an external connection port 2707, an antenna 2708, etc. The present invention is applied to the display unit 2703. If the display unit 2703 displays white characters on a black background, power consumption of the cellular phone can be reduced.

As described above, the display apparatus obtained by applying the present invention may be used as the display units of every electronic. Since the stability of the performance of the display apparatus can be improved and the design margin in the circuit design can be expanded in the present invention, the low-cost display apparatus can be provided and the electronics parts cost can be lowered. Also, the electronics of the present Embodiment may use any configuration of the display apparatuses shown in Embodiments 1 to 6.

Embodiment 8

In this embodiment, the explanation is made with respect to an example of a light emitting device (particularly, similar to an upper-surface irradiation type device shown in FIG. 6B) having an element structure which differs from the element structure of the light emitting device described in the second embodiment 2. Here, since the basic structure of this embodiment is equal to the structure shown in FIGS. 5A–C and FIGS. 6A–B, detailed explanation of the structure is omitted and symbols are referred to when necessary.

In the light emitting device shown in FIG. 14A, each one of a power source line 553, a drain line 521 and a data line 551 is formed of a metal film having a laminar structure. Here, the light emitting device is characterized by the structure of the drain line 521. This point is explained in conjunction with an enlarged view shown in FIG. 15 (an enlarged view of a portion surrounded by a dotted line 1400 in FIG. 14A).

Figure 15:
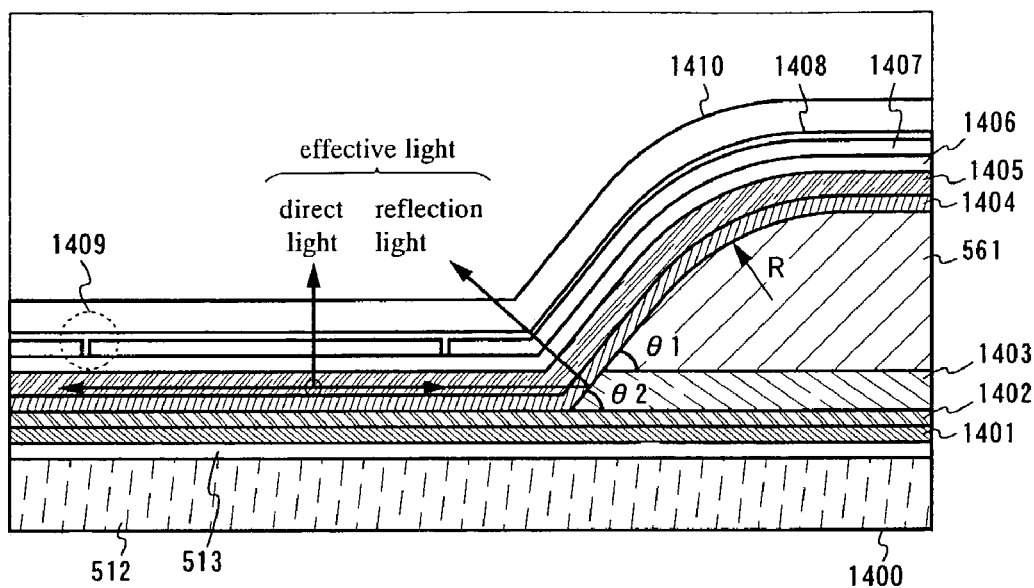
FIG. 15 is a view partially enlarging the cross-sectional structure of the light emitting device.

In FIG. 15, numeral 512 indicates an SOG film which is used as a leveling film and numeral 513 indicates a second passivation film formed on the SOG film 512. A drain line 521 practically has a three-layered structure consisting of a first line 1401, a second line 1402 and a third line 1403. The first line 1401 is preferably made of a material which is capable of having an ohmic contact with a drain region (silicon film) and, to be more specific, is preferably made of titanium. A film thickness of the first line 1401 is preferably 10 to 100 nm. The second line 1402 is preferably made of a material which can ensure a selection ratio with the third line 1403 and has a relatively high work function as a thin film. To be more specific, TiN, Pt, Cr, W, Ni, Zn, Sn or the like is named as the material of the second line 1402. A film thickness of the second line 1402 may preferably be 10 to 100 nm. Further, the third line 1403 is preferably made of a material having low resistance. To be more specific, the third line 1403 is preferably made of metal or alloy containing aluminum or copper as a main component. A film thickness of the third line 1403 is preferably 0.5 to 1.5 µm.

In this embodiment, the first line 1401 is formed of a titanium film, the second line 1402 is formed of a titanium nitride film or a tungsten nitride film, and the third line 1403 is formed of an aluminum film (including an aluminum alloy film or a film which is formed by doping an aluminum alloy film or an aluminum film with impurities. Here, a titanium nitride film may be formed on the third line 1403 as a fourth line.

The feature of this embodiment lies in a point that after forming the drain line 521, a photosensitive resin film 561 is formed on the drain line 521, and using the photosensitive resin film 561 as a mask, the third line 1403 (or the third line 1403 and the second line 1402) is etched in a self-aligning manner. That is, the exposed second line 1402 (or the first line 1401) functions as an anode of an EL element. Here, when the titanium nitride film is used as the anode, it is possible to increase the work function by preliminarily applying an ultraviolet rays irradiation so that the titanium nitride film can be used as the anode more effectively.

Although either a dry etching method or a wet etching method can be adopted as the above-mentioned etching method, when the dry etching method is used, $BCl_3$ and $Cl_2$ are used as an etching gas. That is, when the third line 1403 is etched, the second line 1402 or the first line 1401 functions as an etching stopper and hence, there arises no problem.

Here, with respect to the photosensitive resin film 561, to enhance the ability to cover a light emitting layer and a cathode of an EL element formed on the photosensitive resin film 561, it is preferable that the photosensitive resin film 561 has a gentle upper end portion in shape. That is, a radius of curvature (R) shown in FIG. 15 is set to 0.2 to 3 µm. Further, a taper angle at a lower end portion thereof (angle made with the third line 1403) ($\theta_1$) may be selected from a range of $30°<\theta_1<70°$ (typically, $40°<\theta_1<50°$). Further, with respect to the shape of the third line 1403 after etching, a taper angle at a lower end portion thereof (angle made with the second line 1402) ($\theta_2$) may be also selected from a range of $30°<\theta_2<70°$. Here, it is preferable to establish the relationship $\theta_1=\theta_2$. Here, the reason that the taper angle $\theta_2$ is set to $30°<\theta_2<70°$ is that when the taper angle $\theta_2$ is not less than 70° or not more than 30°, it is difficult to irradiate a reflection light in the upward direction.

A recessed portion is formed in the drain line 521 in this manner and a positive hole injection layer 1404 and a light emitting layer 1405 are formed on the drain line 521 using a spin coating method. As the positive hole injection layer 1404, to smooth a stepped portion of the third line 1403, it is preferable to form a PEDOT/PSS (poly (ethylenedioxy thiophene)/poly (styrene sulfonic acid)) film using the spin coating method. Further, the light emitting layer 1405 can be formed by a vapor deposition method, a printing method, the spin coating method, a spray method or an ink jet method using known material. In this embodiment, a polyvinyl carbazole (PVK) film doped with a light emitting center pigment (1,1,4,4-tetraphenyl-1,3-butadiene (TPB), 4-dicyanomethylene-2-methyl-6-(p-dimethyleamino-styryl)-4H-pyran (DCM1), Nile red, cumarin 6 or the like) is formed. It is preferable to set film thicknesses of respective layers to 100 to 150 nm.

Further, a cathode 1406 having a thin film thickness of 20 to 100 nm is formed on the light emitting layer 1405. With the use of the film having such a thin film thickness, it is possible to sufficiently enhance the transmissivity with respect to a visible light. As a material of the cathode 1406, it is possible to use an MgAg (alloy of magnesium and silver) film or an aluminum film containing element belonging to a first group or a second group of the Periodic Table (typically alloy film of aluminum and lithium).

Further, a conductive film 1407 having a film thickness of 30 to 100 nm is formed on the cathode 1406. By setting the film thickness of the conductive film 1407 to a small value of 30 to 100 nm, it is possible to sufficiently enhance the transmissivity with respect to a visible light. As the conductive film 1407, it is preferable to use an aluminum film (also including element belonging to a first group or a second group of the Periodic Table preferably). The aluminum film exhibits a high blocking effect for moisture and oxygen and has characteristics that the aluminum film per se absorbs oxygen and expands a volume thereof and hence, the aluminum film has an advantage that the film exhibits strong resistance against the time-sequential deterioration attributed to oxygen and moisture and hence, it is understood that the aluminum film is suitable as a protective film. Further, it is also possible to have an advantageous effect that an aluminum oxide 1408 which is formed on a surface of the aluminum film performs a role of embedding pinholes formed in the aluminum film 1407 (a portion indicated by numeral 1409). It is needless to say that the aluminum oxide film 1408 has high transmissivity with respect to a visible light and hence, there arises no problem. Here, as the conductive film 1407, a known transparent conductive film (conductive film made of indium oxide, tin oxide, zinc oxide or a compound formed by combining these materials) may be used.

Further, on the conductive film 1407 (aluminum oxide film 1408 when the conductive film 1407 is made of an aluminum film), an insulation film having light transmitting property (silicon oxide film, silicon nitride film, silicon oxide nitride film or diamond-like carbon film) 1410 may be formed.

Further, as can be understood from the light emitting device shown in FIG. 14B, to lower the resistance of the cathode 1406, an auxiliary electrode 1411 may be formed on the conductive film 1407. As the auxiliary electrode 1411, an alloy film containing aluminum or copper may be preferably used. Further, since the light emitting layer is already formed, it is preferable to form the auxiliary electrode 1411 by a vapor deposition method.

By adopting the above-mentioned structure, it is possible to achieve an action that out of light (direct light) generated by the light emitting layer 1405, leaking of light which propagates in the lateral direction in films of the light emitting layer 1405 or the positive hole injection layer 1404, is reflected on an inclined surface of the third line 1403 and is returned upwardly so that reflection light components are increased. That is, it is possible to enhance the takeout efficiency of light which are effectively used (effective light), whereby it is possible to provide a bright light emitting device with low power consumption (see an arrow in FIGS. 14A–B).

Here, this embodiment can be put into practice in a mode that this embodiment is freely combined with any one of constitutions described in the embodiments 1 to 4, 6 and 7.

Embodiment 9

In this embodiment, an example in which a tail portion having a desired radius of curvature is formed by skillfully changing an etched shape of the second line 1402 or the third line 1403 in the light emitting device described in the embodiment 8 is explained.

Figure 16A:
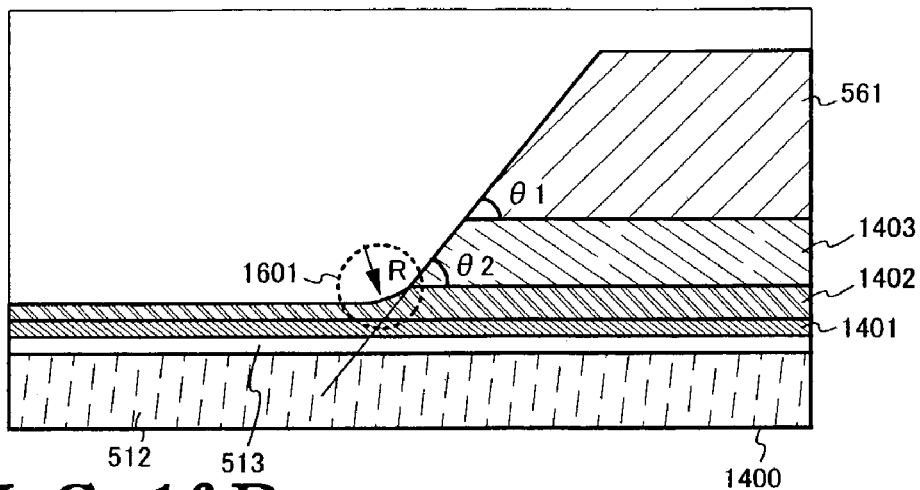
FIGS. 16A–C are views partially enlarging the cross-sectional structure of the light emitting device.

FIG. 16A is a view showing steps of the embodiment 8 ranging from forming of the photosensitive resin film 561 to etching of the third line 1403. Here, by applying overetching to the second line 1402, the second line 1402 is etched by 5 to 50 nm from a surface thereof and a curvature is given to a tail portion 1601 of the second line 1402. A radius of curvature (R) may preferably be set to a value within a range of 0.1 to 100 µm here.

Figure 16B:
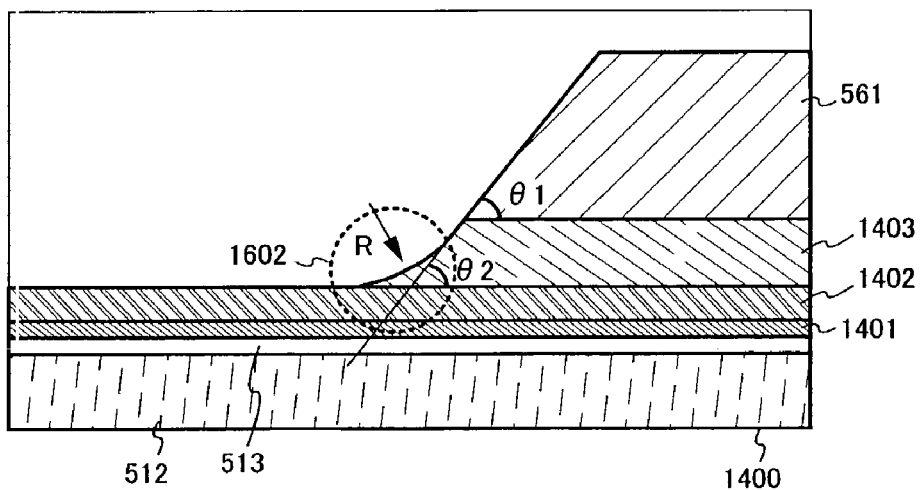

FIG. 16B is a view showing steps of the embodiment 8 ranging from forming of the photosensitive resin film 561 to etching of the third line 1403. Here, the second line 1402 is used as an etching stopper and, at the same time, a curvature is given to a tail portion of the second line 1402. A radius of curvature (R) may preferably be set to a value within a range of 0.1 to 100 µm here.

Figure 16C:
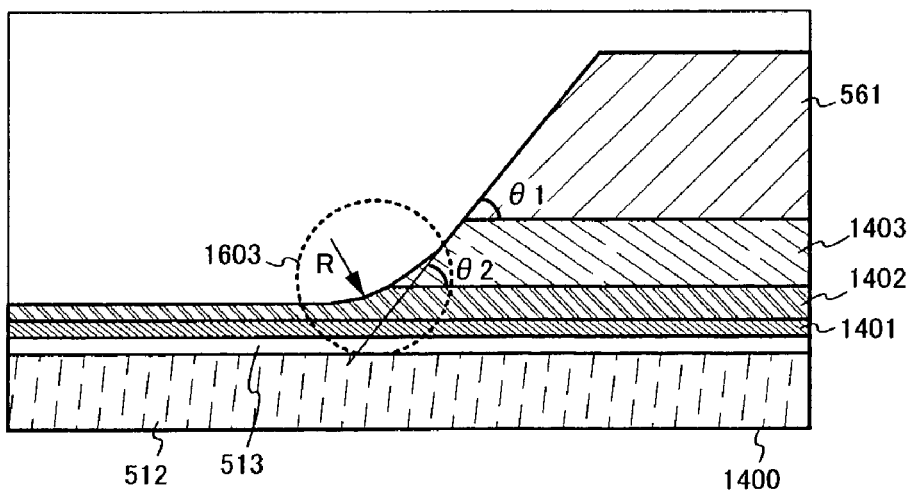

FIG. 16C is a view showing steps of the embodiment 8 ranging from forming of the photosensitive resin film 561 to etching of the third line 1403. Here, by applying overetching to the second line 1402, the second line 1402 is etched by 5 to 50 nm from a surface thereof and a curvature is given to both of the second line 1402 and the third line 1403 at a tail portion 1603. A radius of curvature (R) may preferably be set to a value within a range of 0.1 to 100 µm here.

As described above, by giving the curvature to the second line 1402, the third line 1403 or both of these lines, it is possible to efficiently reflect light generated by the light emitting layer upwardly so that the light takeout efficiency is further enhanced.

Embodiment 10

In this embodiment, an example of light emitting method applicable to the light emitting devices in the embodiments 2 to 4 and 6 to 9 is explained. The explanation is made in conjunction with FIGS. 17A–C.

FIG. 17A is a method in which a light emitting layer which emits a white light is used as an EL element and the light emitted from the light emitting layer is separated into respective light emitting colors of red (R), green (G) and blue (B) by means of color filters (CF). For example, by dispersing proper amounts of four types of pigments (TPB, cumarin 6, DCM1, Nile red) in the inside of the light emitting layer, the white light emitting is obtained. Here, the constitution and material of the light emitting layer which perform white light emitting may preferably be formed of known constitution and known material.

FIG. 17B is a method in which a light emitting layer which emits a blue light is used as an EL element and the light emitted from the light emitting layer is converted into respective light emitting colors of red (R), green (G) and blue (B) by means of a color converting layer (also referred to as "CCM method" (color changing mediums)). In this case, since the lights which are obtained by color conversion are present in a broad range, only light components having sharp peaks may be taken out by providing the color filters (CF) so as to enhance a contrast. Here, the constitution and material of the light emitting layer which performs blue light emitting may preferably be formed of known constitution and known material, while the color converting layer may preferably be formed of known material.

FIG. 17C is a method which produces three light emitting layers corresponding to respective light emissions of red (R), green (G) and blue (B) as EL elements. In this case, it is preferable to adopt a vapor deposition method which can easily produce the light emitting layers separately using a metal mask or the like. Here, the constitution and material of the light emitting layers which emit lights in respective colors of red, green and blue may preferably be formed of known constitutions and materials.

Here, this embodiment can be put into practice in a mode that this embodiment is freely combined with any one of constitutions described in the embodiments 1 to 4 and 6 to 9.

Note that the SOG film is adopted as the interlayer insulation film (interlayer insulating film) in the present invention described in this specification, but a film formed by applying solution containing a thin film forming material other than the SOG film may be used as an interlayer insulating film.

According to the present invention, it is possible to manufacture the display device using a process which allows high design margin in circuit designing while ensuring the stability of the operational performance of the thin film transistor whereby the stability of the operational performance of the display device can be enhanced. Further, along with manufacturing of the above-mentioned thin film transistor, the large capacitance is generated with a small area without increasing photolithography steps particularly and hence, the image quality of the display device can be enhanced.

What is claimed is:

1. A semiconductor device comprising:
   an active layer;
   a gate insulating film over the active layer;
   a gate electrode over the active layer with the gate insulating film interposed therebetween;
   a first inorganic insulating film formed over the active layer;
   an SOG film formed over the first inorganic insulating film, said SOG film having a first opening;
   a second inorganic insulating film formed over the SOG film; and
   a wiring formed over the second inorganic insulating film;
   wherein an inner wall surface of the first opening is covered with the second inorganic insulating film,
   wherein said SOG film comprises silicon oxide,
   wherein a second opening formed in a laminated body including the gate insulating film, the first inorganic insulating film and the second inorganic insulating film is provided to the inside of the first opening, and
   wherein the active layer and the wiring are connected to each other through the first opening and the second opening.

2. A semiconductor device comprising:
   an active layer;
   a gate insulating film over the active layer;
   a gate electrode over the active layer with the gate insulating film interposed therebetween;
   a first inorganic insulating film formed over the active layer;
   an SOG film formed over the first inorganic insulating film, said SOG film having a first opening;
   a second inorganic insulating film formed over the SOG film; and
   a wiring formed over the second inorganic insulating film,
   wherein an inner wall surface of the first opening is covered with the second inorganic insulating film,
   wherein said SOG film comprises silicon oxide,
   wherein a region where the first inorganic insulating film and the second inorganic insulating film are brought into contact with each other by 0.3 to 3 µm in width is provided to a bottom surface of the first opening,
   wherein a second opening formed in a laminated film including the gate insulating film, the first inorganic insulating film and the second inorganic insulating film is provided to the inside of the first opening, and
   wherein the active layer and the wiring are connected to each other through the first opening and the second opening.

3. A semiconductor device according to claim 1, wherein the first inorganic insulating film and the second inorganic insulating film are formed of a film selected from a group consisting of a silicon nitride film, a silicon nitride oxide film, a silicon oxide nitride film, an aluminum nitride film, an aluminum nitride oxide film or an aluminum oxide nitride film.

4. A semiconductor device according to claim 2, wherein the first inorganic insulating film and the second inorganic insulating film are formed of a film selected from a group consisting of a silicon nitride film, a silicon nitride oxide film, a silicon oxide nitride film, an aluminum nitride film, an aluminum nitride oxide film or an aluminum oxide nitride film.

5. A display device comprising a pixel portion over a substrate, the pixel portion including a plurality of pixels each comprising a semiconductor device and a holding capacitance which is connected to the semiconductor device, the semiconductor device comprising:
 an active layer;
 a gate insulating film over the active layer;
 a gate electrode over the active layer with the gate insulating film interposed therebetween;
 a first inorganic insulating film formed over the active layer;
 an SOG film formed over the first inorganic insulating film, said SOG film having a first opening;
 a second inorganic insulating film formed over the SOG film; and
 a wiring formed over the second inorganic insulating film,
 wherein an inner wall surface of the first opening is covered with the second inorganic insulating film,
 wherein said SOG film comprises silicon oxide,
 wherein a second opening formed in a laminated body including the gate insulating film, the first inorganic insulating film and the second inorganic insulating film is provided to the inside of the first opening,
 wherein the active layer and the wiring are connected to each other through the first opening and the second opening, end
 wherein the holding capacitance includes the first inorganic insulating film and the second insulating film as dielectrics.

6. A display device comprising a pixel portion over a substrate, the pixel portion including a plurality of pixels each comprising a semiconductor device and a holding capacitance connected to semiconductor device, the semiconductor device comprising:
 an active layer;
 a gate insulating film over the active layer;
 a gate electrode over the active layer with the gate insulating film interposed therebetween;
 a first inorganic insulating film formed over the active layer;
 an SOG film formed over the first inorganic insulating film, said SOG film having a first opening;
 a second inorganic insulating film formed over the SOG film; and
 a wiring formed over the second inorganic insulating film,
 wherein an inner wall surface of the first opening is covered with the second inorganic insulating film,
 wherein said SOG film comprises silicon oxide,
 wherein a region where the first inorganic insulating film and the second insulating film are brought into contact with each other with a contact length of 0.3 to 3 µm in width is provided to a bottom surface of the first opening,
 wherein a second opening formed in a laminated body including the gate insulating film, the first inorganic insulating film and the second inorganic insulating film is provided to the inside of the first opening,
 wherein the active layer and the wiring are connected to each other through the first opening and the second opening, and
 wherein the holding capacitance includes the first inorganic insulating film and the second insulating film as dielectrics.

7. A display device according to claim 5,
 wherein the first inorganic insulating film and the second inorganic insulating film are formed of a film selected from a group consisting of a silicon nitride film, a silicon nitride oxide film, a silicon oxide nitride film, an aluminum nitride film, an aluminum nitride oxide film or an aluminum oxide nitride film.

8. A display device according to claim 6,
 wherein the first inorganic insulating film and the second inorganic insulating film are formed of a film selected from a group consisting of a silicon nitride film, a silicon nitride oxide film, a silicon oxide nitride film, an aluminum nitride film, an aluminum nitride oxide film or an aluminum oxide nitride film.

9. An electronic device having the semiconductor device according to claim 1, wherein said electronic device is selected from the group consisting of a television, a digital camera, a laptop computer, a mobile computer, a portable image reproducing apparatus, a goggle type display, a video camera and a cellular phone.

10. An electronic device having the semiconductor device according to claim 2, wherein said electronic device is selected from the group consisting of a television, a digital camera, a laptop computer, a mobile computer, a portable image reproducing apparatus, a goggle type display, a video camera and a cellular phone.

11. An electronic device having the display device according to claim 5, wherein said electronic device is selected from the group consisting of a television, a digital camera, a laptop computer, a mobile computer, a portable image reproducing apparatus, a goggle type display, a video camera and a cellular phone.

12. An electronic device having the display device according to claim 6, wherein said electronic device is selected from the group consisting of a television, a digital camera, a laptop computer, a mobile computer, a portable image reproducing apparatus, a goggle type display, a video camera and a cellular phone.

13. A semiconductor device comprising:
 an active layer;
 a gate insulating film over the active layer;
 a gate electrode over the active layer with the gate insulating film interposed therebetween;
 a first inorganic insulating film formed over the active layer;
 a film comprising silicon oxide formed by applying solution containing a thin film forming material over the first inorganic insulating film, said film having a first opening;
 a second inorganic insulating film formed over said film having said first opening; and
 a wiring formed over the second inorganic insulating film;
 wherein an inner wall surface of the first opening is covered with the second inorganic insulating film;
 wherein a second opening formed in a laminated body including the gate insulating film, the first inorganic insulating film and the second inorganic insulating film is provided to the inside of the first opening; and
 wherein the active layer and the wiring are connected to each other through the first opening and the second opening.

14. A semiconductor device according to claim 13,
 wherein a region where the first inorganic insulating film and the second insulating film are brought into contact with each other with a contact length of 0.3 to 3 μm in width is provided to a bottom surface of the first opening.

15. A semiconductor device according to claim 13, wherein the film comprising silicon oxide formed by applying solution containing said thin film forming material is selected from the group consisting of an SiOx film, a phosphorus silicate glass film, a boron silicate glass film and a boron phosphorus silicate glass film.

16. An electronic device having the semiconductor device according to claim 13, wherein said electronic device is selected from the group consisting of a television, a digital camera, a laptop computer, a mobile computer, a portable image reproducing apparatus, a goggle type display, a video camera and a cellular phone.

17. The semiconductor device according to claim 1, wherein said SOG film comprising the following structure:

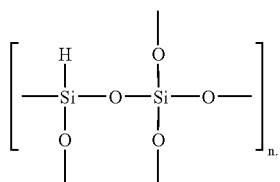

18. The semiconductor device according to claim 2, wherein said SOG film comprising the following structure:

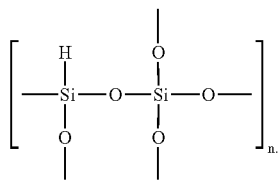

19. The display device according to claim 5, wherein said SOG film comprising the following structure:

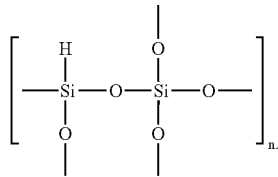

20. The display device according to claim 6, wherein said SOG film comprising the following structure:

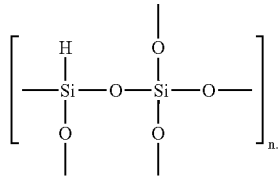

21. The semiconductor device according to claim 13, wherein said SOG film comprising the following structure:

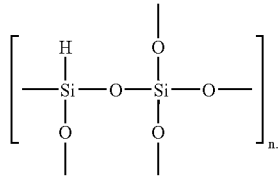

* * * * *